US012598829B2

(12) United States Patent
Kim et al.

(10) Patent No.: US 12,598,829 B2
(45) Date of Patent: Apr. 7, 2026

(54) IMAGE SENSOR AND ELECTRONIC SYSTEM INCLUDING THE SAME

(71) Applicant: Samsung Electronics Co., Ltd., Suwon-si (KR)

(72) Inventors: Munhwan Kim, Suwon-si (KR); Kyungho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 315 days.

(21) Appl. No.: 18/135,637

(22) Filed: Apr. 17, 2023

(65) Prior Publication Data

US 2024/0055458 A1 Feb. 15, 2024

(30) Foreign Application Priority Data

Aug. 11, 2022 (KR) ........................ 10-2022-0100587

(51) Int. Cl.
*H10F 39/00* (2025.01)
*H10F 39/12* (2025.01)
*H10F 39/18* (2025.01)

(52) U.S. Cl.
CPC ......... *H10F 39/807* (2025.01); *H10F 39/182* (2025.01); *H10F 39/199* (2025.01); *H10F 39/8053* (2025.01); *H10F 39/8063* (2025.01)

(58) Field of Classification Search
None
See application file for complete search history.

(56) References Cited

U.S. PATENT DOCUMENTS

| | | | |
|---|---|---|---|
| 10,468,449 B2 | 11/2019 | Lee | |
| 11,265,496 B2 | 3/2022 | Kim et al. | |
| 12,266,669 B2* | 4/2025 | Cho ..................... | H04N 25/704 |
| 2017/0347042 A1* | 11/2017 | Borthakur ........... | H04N 25/585 |
| 2019/0280034 A1 | 9/2019 | Jeon et al. | |
| 2020/0219911 A1 | 7/2020 | Hur et al. | |
| 2020/0286937 A1 | 9/2020 | Honda et al. | |
| 2020/0365628 A1 | 11/2020 | Kim et al. | |
| 2022/0384496 A1* | 12/2022 | Cheng ................... | H10F 39/809 |
| 2023/0420473 A1* | 12/2023 | Yang ..................... | H10F 39/024 |
| 2024/0030258 A1* | 1/2024 | Cheng .................. | H10F 39/807 |

FOREIGN PATENT DOCUMENTS

CN 101958319 A 1/2011

* cited by examiner

*Primary Examiner* — Nilufa Rahim
(74) *Attorney, Agent, or Firm* — Muir Patent Law, PLLC

(57) ABSTRACT

An image sensor includes a color unit pixel comprising sub-pixels arranged in an m×n matrix on a substrate, and a pixel isolation structure isolating the sub-pixels from each other in the color unit pixel. The pixel isolation structure includes an outer isolation film surrounding the color unit pixel, at least one inner isolation film including a portion between two sub-pixels, which are adjacent to each other, among the sub-pixels, a doped isolation liner covering opposite sidewalls of the at least one inner isolation film, and at least one doped isolation pillar contacting at least two sub-pixels selected from the sub-pixels. The at least one doped isolation pillar and the at least one inner isolation film are arranged to define a size of a partial region of each of the sub-pixels.

20 Claims, 30 Drawing Sheets

100

100

I - I'

II - II'

I - I'

II - II'

I - I'

II - II'

I - I'

II - II'

II - II'

I - I'

II - II'

II - II'

IMAGE SENSOR AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0100587, filed on Aug. 11, 2022, in the Korean Intellectual Property Office, the disclosure of which is incorporated by reference herein in its entirety.

BACKGROUND

The inventive concept relates to an image sensor and an electronic system including the same, and more particularly, to an image sensor including a plurality of photodiodes and an electronic system including the image sensor.

With the development of the computer industry and the communication industry, image sensors configured to capture images and convert the images into electric signals are used in various fields, such as digital cameras, camcorders, personal communication systems (PCSs), game consoles, security cameras, medical micro cameras, and mobile phones. To embody high-sensitivity image sensors with an increase in the integration density of image sensors and the miniaturization of pixel sizes, the widths of sensing areas defined by a pixel isolation structure are being gradually reduced, and the heights thereof are being gradually increased. Thus, aspect ratios of the sensing areas are increasing. Accordingly, during the manufacture of image sensors, process failures, such as undesired leaning of patterns and collapse of patterns for forming the sensing areas, may occur.

SUMMARY

The inventive concept provides an image sensor configured to be capable of preventing the occurrence of process failures, such as undesired leaning of patterns and collapse of patterns for forming sensing areas included in the image sensor, during the manufacture of the image sensor even when aspect ratios of the sensing areas are relatively high.

The inventive concept also provides an electronic system including an image sensor configured to be capable of preventing the occurrence of process failures, such as undesired leaning of patterns and collapse of patterns for forming sensing areas included in the image sensor, during the manufacture of the image sensor even when aspect ratios of the sensing areas are relatively high.

According to an aspect of the inventive concept, an image sensor includes a color unit pixel comprising a plurality of sub-pixels arranged in an $m \times n$ matrix on a substrate, wherein each of m and n is a natural number of 2 to 10, and a pixel isolation structure isolating the plurality of sub-pixels from each other in the color unit pixel. The pixel isolation structure includes an outer isolation film surrounding the color unit pixel, at least one inner isolation film including a portion between two sub-pixels, which are adjacent to each other, among the plurality of sub-pixels, a doped isolation liner covering opposite sidewalls of the at least one inner isolation film, and at least one doped isolation pillar contacting at least two sub-pixels selected from the plurality of sub-pixels. The at least one doped isolation pillar and the at least one inner isolation film are arranged to define a size of a partial region of each of the plurality of sub-pixels.

According to an aspect of the inventive concept, an image sensor includes a pixel group on a substrate, the pixel group including a plurality of color unit pixels arranged in a $2 \times 2$ matrix, and a pixel isolation structure configured to isolate a plurality of sub-pixels from each other in each of the plurality of color unit pixels. In one color unit pixel selected from the plurality of color unit pixels, the plurality of sub-pixels are arranged in an $m \times n$ matrix and comprise pixels of the same color, wherein each of m and n is a natural number of 2 to 10. The pixel isolation structure includes an outer isolation film surrounding the color unit pixel, at least one inner isolation film comprising a portion between two sub-pixels, which are adjacent to each other from among the plurality of sub-pixels, a doped isolation liner covering opposite sidewalls of the at least one inner isolation film, and at least one doped isolation pillar contacting at least two sub-pixels selected from the plurality of sub-pixels. The at least one doped isolation pillar and the at least one inner isolation film are arranged to define a size of a partial region of each of the plurality of sub-pixels.

According to an aspect of the inventive concept, an electronic system includes at least one camera module comprising an image sensor and a processor configured to process image data received from the at least one camera module. The image sensor includes a color unit pixel comprising a plurality of sub-pixels arranged in an $m \times n$ matrix on a substrate, wherein each of m and n is a natural number of 2 to 10, and a pixel isolation structure configured to isolate the plurality of sub-pixels from each other in the color unit pixel. The pixel isolation structure includes an outer isolation film surrounding the color unit pixel, at least one inner isolation film comprising a portion between two sub-pixels, which are adjacent to each other, among the plurality of sub-pixels, a doped isolation liner covering opposite sidewalls of the at least one inner isolation film, and at least one doped isolation pillar contacting at least two sub-pixels selected from the plurality of sub-pixels. The at least one doped isolation pillar and the at least one inner isolation film are arranged to define a size of a partial region of each of the plurality of sub-pixels.

BRIEF DESCRIPTION OF THE DRAWINGS

Embodiments of the inventive concept will be more clearly understood from the following detailed description taken in conjunction with the accompanying drawings in which:

FIGS. 3A to 3D are specific diagrams of a configuration of an image sensor according to embodiments, wherein FIG. 3A is a plan view of an example structure of sub-pixels shown in FIG. 2, FIG. 3B is a cross-sectional view taken along line I-I' of FIG. 3A, and FIG. 3C is a cross-sectional view taken along line II-II' of FIG. 3A, and FIG. 3D is a plan view of some components of an image sensor according to embodiments, at a predetermined vertical level;

FIGS. 11A to 18B are cross-sectional views of a process sequence of a method of manufacturing an image sensor, according to embodiments, wherein FIGS. 11A, 12A, 13A, 14A, 15A, 16A, 17A, and 18A are each a cross-sectional view of a portion corresponding to a cross-section taken along line I-I' of FIG. 3A, according to a process sequence. FIGS. 11B, 12B, 13B, 14B, 15B, 16B, 17B, and 18B are each a cross-sectional view of a portion corresponding to a cross-section taken along line II-II' of FIG. 3A, according to a process sequence.

DETAILED DESCRIPTION OF THE EMBODIMENTS

Figure 1:
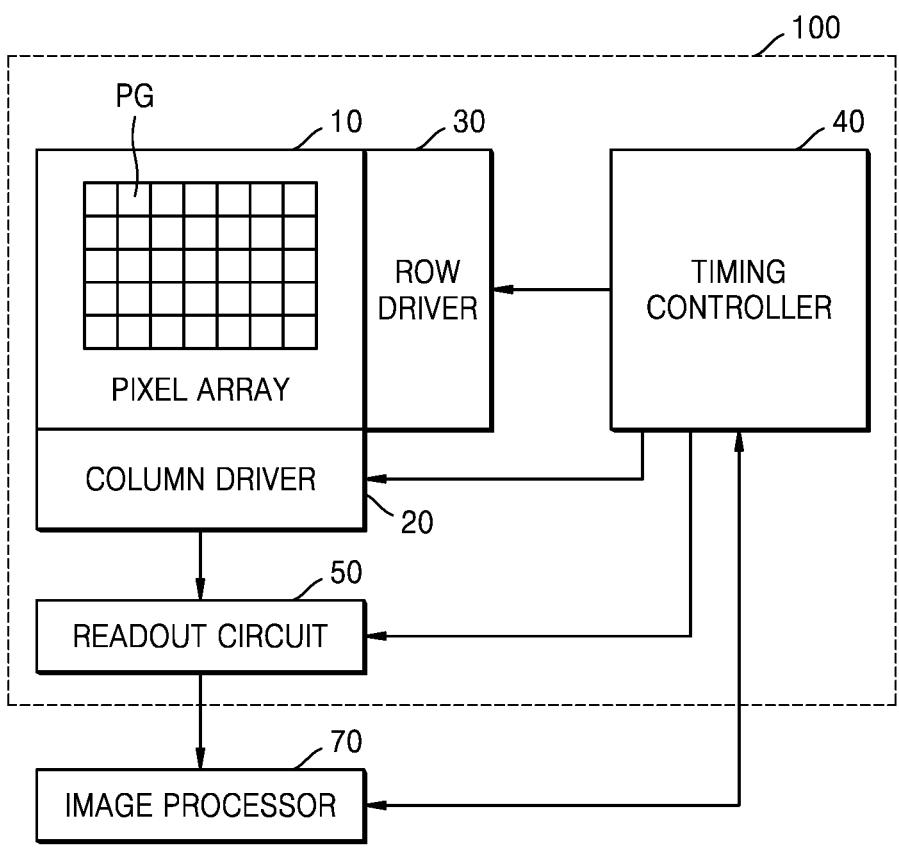
FIG. 1 is a block diagram of an image sensor according to embodiments.

Hereinafter, embodiments will be described in detail with reference to the accompanying drawings. The same reference numerals are used to denote the same elements in the drawings, and repeated descriptions thereof are omitted.

FIG. 1 is a block diagram of an image sensor 100 according to embodiments.

Referring to FIG. 1, the image sensor 100 may include a pixel array 10 and circuits configured to control the pixel array 10. In embodiments, the circuits configured to control the pixel array 10 may include a column driver 20, a row driver 30, a timing controller 40, and a readout circuit 50.

The image sensor 100 may operate according to a control command received from an image processor 70, and may convert light transmitted from an external object into an electrical signal and output the electrical signal to the image processor 70. The image sensor 100 may be a complementary metal-oxide semiconductor (CMOS) image sensor.

The pixel array 10 may include a plurality of pixel groups PG having a two-dimensional (2D) array structure arranged in a matrix form along a plurality of row lines and a plurality of column lines. As used herein the term "row" may refer to a set of unit pixels arranged in a lateral direction, from among a plurality of unit pixels included in the pixel array 10, and the term "column" may refer to a set of unit pixels arranged in a longitudinal direction, from among the plurality of unit pixels included in the pixel array 10.

Each of the plurality of pixel groups PG may have a multi-pixel structure including a plurality of photodiodes. In each of the plurality of pixel groups PG, the plurality of photodiodes may generate electric charges by receiving light transmitted from an object. The image sensor 100 may perform an autofocus function by using a phase difference between pixel signals generated from a plurality of photodiodes included in each of the plurality of pixel groups PG. Each of the plurality of pixel groups PG may include a pixel circuit for generating a pixel signal from electric charges generated by the plurality of photodiodes.

The plurality of pixel groups PG may reproduce an object with a combination of a red pixel, a green pixel, and/or a blue pixel. In embodiments, the pixel group PG may include a plurality of color unit pixels that form a Bayer pattern including red, green, and blue colors. A color unit pixel may include at least three sub-pixels arranged in a predetermined configuration, each sub-pixel capable of reproducing a primary color, and the at least three sub-pixels may emit lights through the same color filter to generate the primary color. The pixel group PG may include the plurality of color unit pixels emitting different primary colors to constitute a Bayer pattern. Each of the plurality of color unit pixels included in the pixel group PG may include a plurality of sub-pixels arranged in an m×n matrix. Herein, each of m and n may be a natural number of at least 2, for example, a natural number of 2 to 10. In the plurality of pixel groups PG, a plurality of sub-pixels in each color unit pixel may respectively generate light transmitted through color filters of the same color.

The column driver 20 may include a correlated double sampler (CDS), an analog-to-digital converter (ADC), and the like. The CDS may be connected, through column lines, to the pixel group PG including the sub-pixels included in a row selected by a row selection signal supplied by the row driver 30 and perform correlated double sampling to detect a reset voltage and a pixel voltage. The ADC may convert the reset voltage and the pixel voltage each detected by the CDS into digital signals and transmit the digital signals to the readout circuit 50.

The readout circuit 50 may include a latch or buffer circuit, which is capable of temporarily storing digital signals, an amplifying circuit, and the like, and may temporarily store or amplify digital signals received from the column driver 20 to generate image data. The operation timing of the column driver 20, the row driver 30, and the readout circuit 50 may be determined by the timing controller 40, and the timing controller 40 may operate based on a control command transmitted from the image processor 70.

The image processor 70 may signal-process image data output from the readout circuit 50 and output the signal-processed image data to a display device or store the signal-processed image data in a storage device, such as a memory. When the image sensor 100 is mounted in an autonomous vehicle, the image processor 70 may signal-process image data and transmit the signal-processed image data to a main controller that controls the autonomous vehicle.

Figure 2:
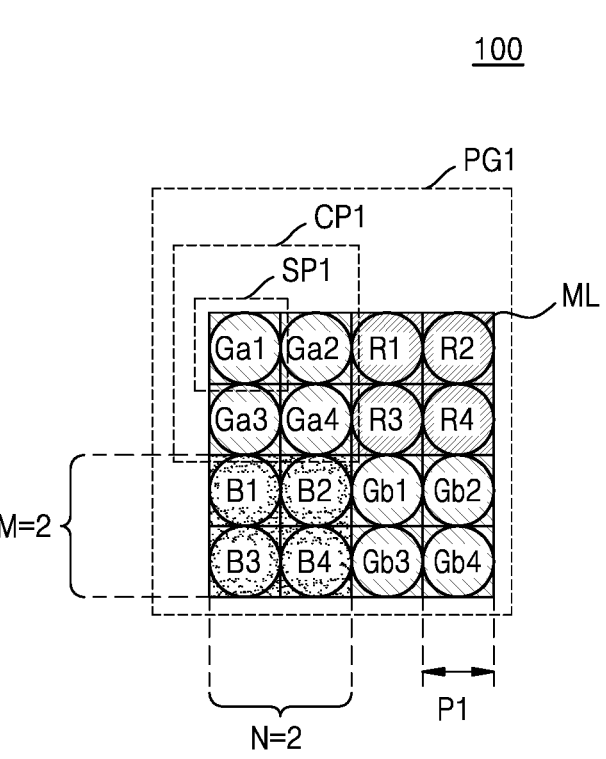
FIG. 2 is a diagram of an example of a pixel group that may be included in an image sensor according to embodiments.

FIG. 2 is a diagram of an example of a pixel group PG1 that may be included in the image sensor 100.

Referring to FIG. 2, the pixel group PG1 may constitute at least one of the plurality of pixel groups PG described with reference to FIG. 1. The pixel group PG1 may include four color unit pixels CP1 that form a Bayer pattern including red, green, and blue colors. Each of a plurality of color unit pixels CP1 may include four sub-pixels SP1 arranged in a 2×2 matrix. The pixel group PG1 may include a first green color unit pixel including four first green sub-pixels Ga1, Ga2, Ga3, and Ga4 arranged in a 2×2 matrix, a red color unit pixel including four red sub-pixels R1, R2, R3, and R4 arranged in a 2×2 matrix, a blue color unit pixel including four blue sub-pixels B1, B2, B3, and B4 arranged in a 2×2 matrix, and a second green color unit pixel including four second green sub-pixels Gb1, Gb2, Gb3, and Gb4 arranged in a 2×2 matrix. One color unit pixel CP1 may include four microlenses ML covering the four sub-pixels SP1. The four microlenses ML may be arranged to correspond one-to-one to the four sub-pixels SP1, respectively. The pixel group PG1 having the arrangement shown in FIG. 2 may be referred to as a tetra cell.

The pixel group PG1 may include two green color unit pixels, one red color unit pixel, and one blue color unit pixel. One color unit pixel CP1 may include four sub-pixels SP1 having the same color information (i.e., emitting lights via color filters of the same color). In embodiments, in the pixel group PG1, the plurality of sub-pixels SP1 may be arranged at a pitch P1 of less than about 1 μm, for example, less than about 0.8 μm or less than about 0.64 μm, without being limited thereto. In embodiments, an aspect ratio of a sensing area SA included in each of the plurality of sub-pixels SP1 may be selected in a range of about 10:1 to about 80:1 (e.g., a range of about 30:1 to about 70:1), without being limited thereto.

Figure 3A:
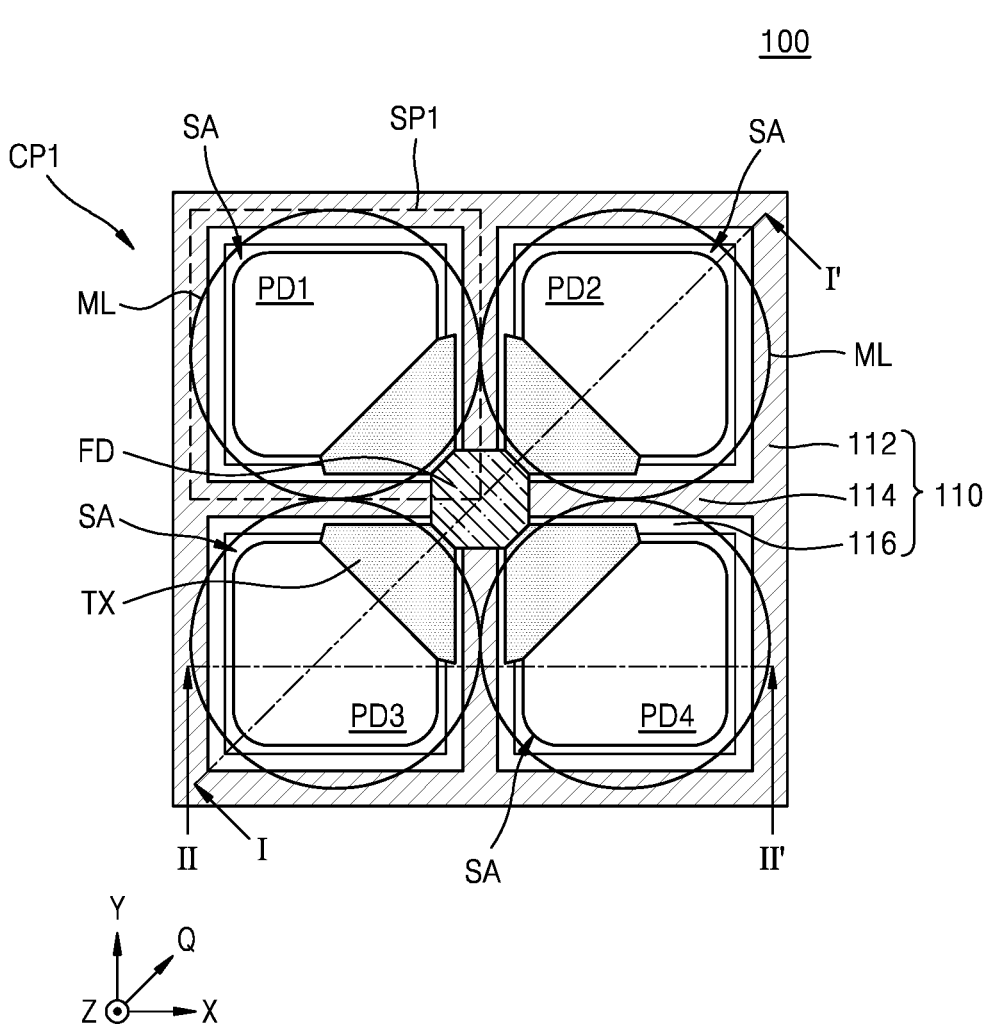
Figure 3B:
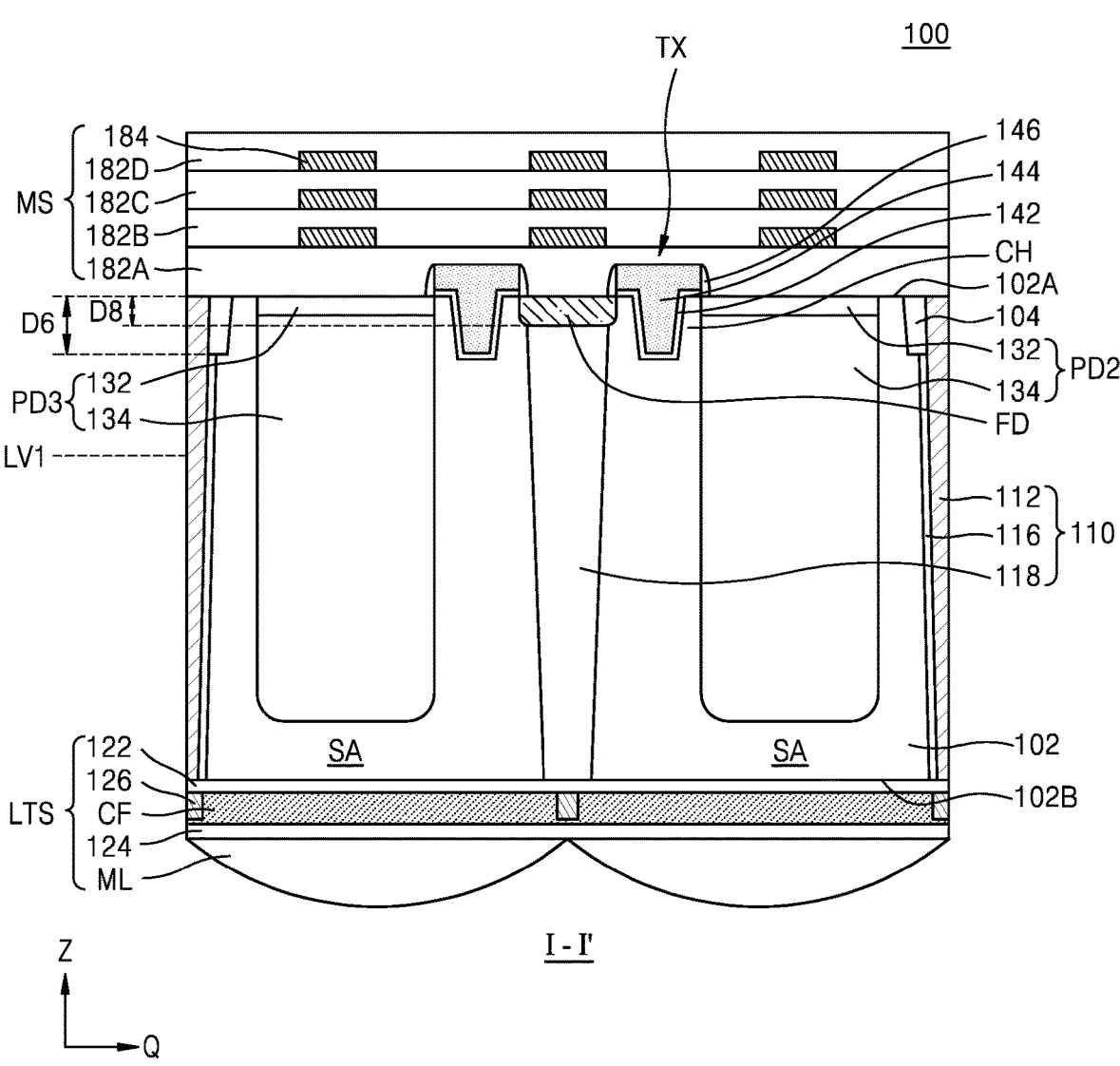
Figure 3C:
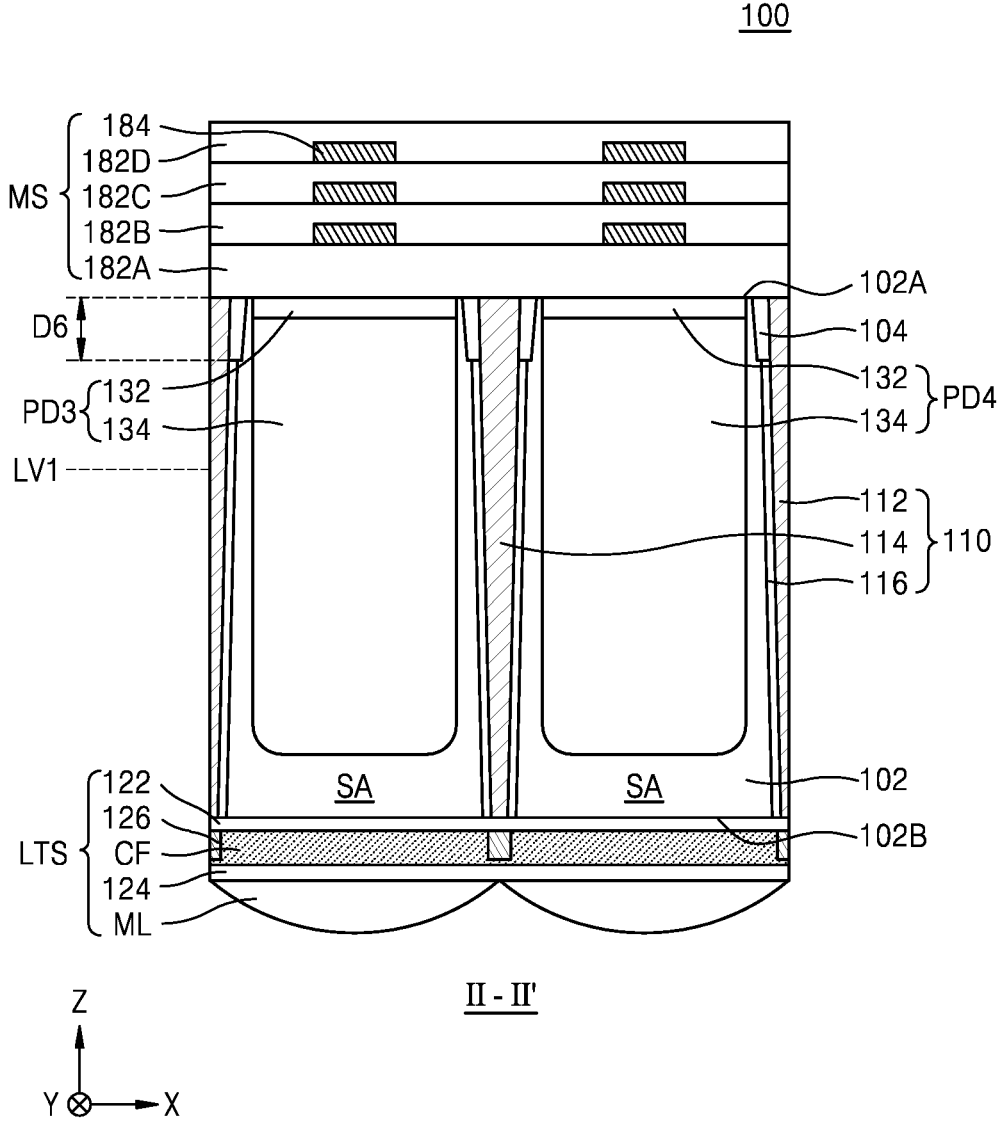
Figure 3D:
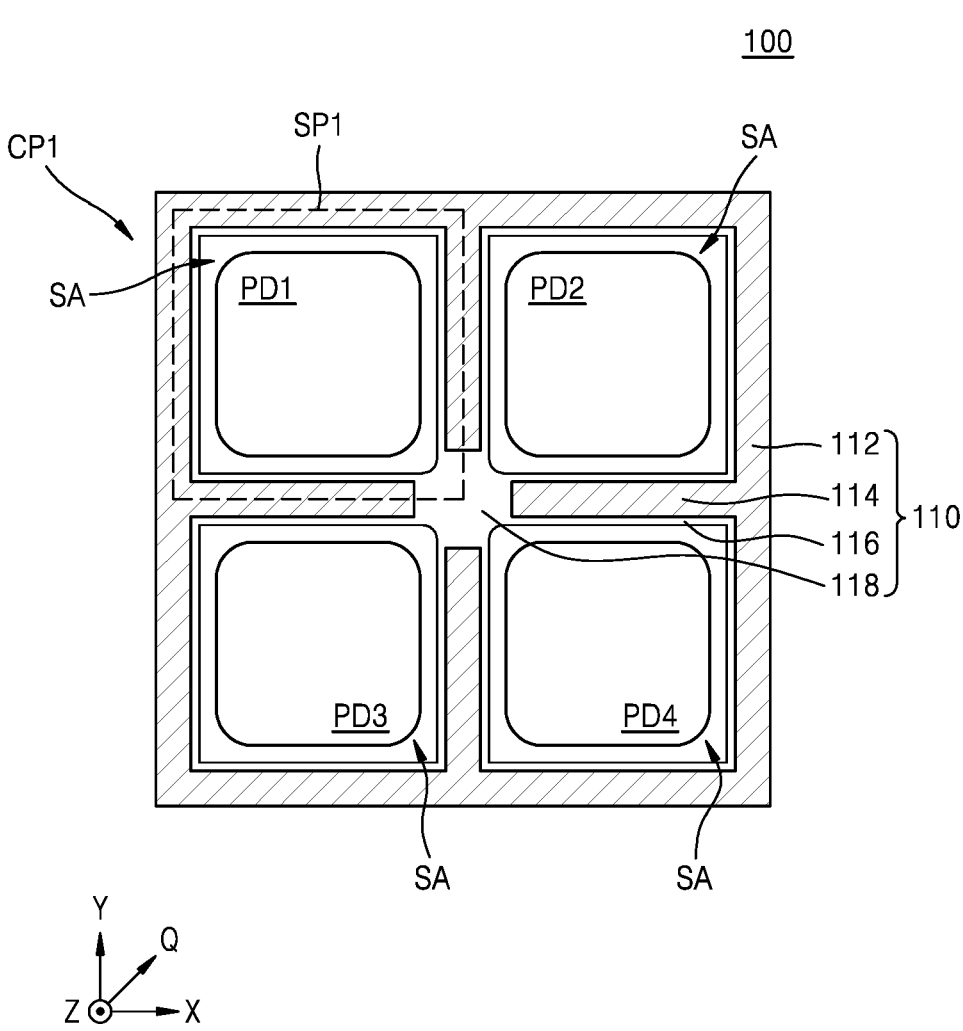

FIGS. 3A to 3D are specific diagrams of a configuration of the image sensor 100 according to embodiments, wherein FIG. 3A is a plan view of an example structure of the sub-pixels SP1 shown in FIG. 2, FIG. 3B is a cross-sectional view taken along line I-I' of FIG. 3A, and FIG. 3C is a cross-sectional view taken along line II-II' of FIG. 3A, and FIG. 3D is a plan view of some components of the image sensor 100 at a vertical level LV1 shown in FIGS. 3B and 3C. An example configuration of a color unit pixel CP1 included in the image sensor 100 will be described with reference to FIGS. 3A to 3D.

Referring to FIGS. 3A to 3D, the image sensor 100 may include the color unit pixel CP1 including four sub-pixels SP1 in a 2×2 matrix on a substrate 102 and a pixel isolation structure 110 configured to isolate the four sub-pixels SP1 from each other in the color unit pixel CP1. Each of the four sub-pixels SP1 may include a sensing area SA defined by the pixel isolation structure 110. The sensing area SA may be an area configured to sense light incident from the outside of the sub-pixels SP1. The four sub-pixels SP1 included in one color unit pixel CP1 may include pixels emitting lights through color filters of the same color. FIGS. 3A to 3D illustrate an example in which the color unit pixel CP1 includes the four sub-pixels SP1 defined by the pixel isolation structure 110, but a configuration of the image sensor 100 may be variously changed and modified within the scope of the inventive concept. The color unit pixel CP1 may include a plurality of sub-pixels arranged in an m×n matrix. Herein, each of m and n may be a natural number of at least 2, for example, a natural number of 2 to 10.

The substrate 102 may include a semiconductor layer. In embodiments, the substrate 102 may include a semiconductor layer doped with P-type impurities. For example, the substrate 102 may include a semiconductor layer including silicon (Si), germanium (Ge), silicon germanium (SiGe), a group II-VI compound semiconductor, a group III-V compound semiconductor, or a combination thereof. In embodiments, the substrate 102 may include a P-type epitaxial semiconductor layer epitaxially grown from a P-type bulk silicon substrate. The substrate 102 may have a front side surface 102A and a back side surface 102B that are opposite to each other.

The color unit pixel CP1 may include a plurality of photodiodes, which are one-by-one in a plurality of sub-pixels SP1, respectively. The plurality of photodiodes may include first to fourth photodiodes PD1, PD2, PD3, and PD4. One sub-pixel SP1 may include a selected one of the first to fourth photodiodes PD1, PD2, PD3, and PD4. The color unit pixel CP1 may have a structure in which one floating diffusion region FD is shared among the first to fourth photodiodes PD1, PD2, PD3, and PD4. Each of the first to fourth photodiodes PD1, PD2, PD3, and PD4 may be arranged around the floating diffusion region FD in the sensing area SA. The first to fourth photodiodes PD1, PD2, PD3, and PD4 may be radially arranged outside the floating diffusion region FD to surround the floating diffusion region FD.

In one color unit pixel CP1, respective transfer transistors TX of the four sub-pixels SP1 may share one floating diffusion region FD as a common drain region. Although FIGS. 3A to 3D illustrate a case in which one floating diffusion region FD is shared among the four sub-pixels SP1 included in one color unit pixel CP1, the inventive concept is not limited thereto. According to the inventive concept, in the one color unit pixel CP1, each of the four sub-pixels SP1 may include a separate floating diffusion region FD or at least two of the four sub-pixels SP1 may share one floating diffusion region FD therebetween.

As shown in FIGS. 3A to 3D, the image sensor 100 may include the pixel isolation structure 110 configured to isolate the plurality of sub-pixels SP1 from each other in the color unit pixel CP1. The pixel isolation structure 110 may include an outer isolation film 112, a plurality of inner isolation films 114, a doped isolation liner 116, and a doped isolation pillar 118.

In the pixel isolation structure 110, the outer isolation film 112 may surround the color unit pixel CP1 to define a size of the color unit pixel CP1. The plurality of inner isolation films 114 may define a size of a partial region of each of the plurality of sub-pixels SP1 in an area defined by the outer isolation film 112. Each of the plurality of inner isolation films 114 may include a portion between two adjacent ones of the plurality of sub-pixels SP1. The doped isolation liner 116 may cover sidewalls of the outer isolation film 112 facing the sensing area SA and opposite sidewalls of each of the plurality of inner isolation films 114 facing the sensing area SA. The doped isolation pillar 118 may include the four sub-pixels SP1 included in one color unit pixel CP1 and define the size of the partial region of each of the plurality of sub-pixels SP1 along with the plurality of inner isolation films 114.

As shown in FIGS. 3B and 3C, an upper sidewall of each of the outer isolation film 112 and the plurality of inner isolation films 114 of the pixel isolation structure 110, which is adjacent to the front side surface 102A of the substrate 102, may be covered by a local isolation film 104. The local isolation film 104 may include a silicon oxide film, without being limited thereto.

As shown in FIG. 3D, in the pixel isolation structure 110, the outer isolation film 112 may be integrally connected to the plurality of inner isolation films 114, and the doped isolation liner 116 may be integrally connected to the doped isolation pillar 118. Four inner isolation films 114 included in one color unit pixel CP1 may be in contact with one doped isolation pillar 118. The term "contact," as used herein, refers to a direct connection (i.e., touching) unless the context indicates otherwise.

As shown in FIG. 3B, in the pixel isolation structure 110, each of a height of an uppermost surface of the doped isolation liner 116 and a height of an uppermost surface of the doped isolation pillar 118 may be less than a height of an uppermost surface of each of the outer isolation film 112 and the plurality of inner isolation films 114. As used herein, the term "height" may refer to a distance from a back side surface 102B of the substrate 102 in a vertical direction (Z direction). In embodiments, a height of the uppermost surface of the doped isolation liner 116 may be different from a height of the uppermost surface of the doped isolation pillar 118. The doped isolation liner 116 may be spaced apart from the front side surface 102A of the substrate 102 by a first depth D6 in the vertical direction (Z direction), and the doped isolation pillar 118 may be spaced apart from the front side surface 102A of the substrate 102) by a second depth D8 in the vertical direction (Z direction). In embodiments, the first depth D6 may be greater than the second depth D8. In other embodiments, the first depth D6 may be less than the second depth D8. In still other embodiments, the first depth D6 may be substantially the same as or similar to the second depth D8.

In the pixel isolation structure 110, the outer isolation film 112 and the inner isolation film 114 may pass through the substrate 102 from the front side surface 120A of the substrate 102 to the back side surface 102B thereof in the vertical direction (Z direction). A width of each of the outer isolation film 112 and the inner isolation film 114 in a lateral direction (e.g., X direction of FIG. 3C) may be greatest in an area adjacent to the front side surface 120A of the substrate 102 and gradually reduce toward the back side surface 102B of the substrate 102.

As shown in FIG. 3B, the floating diffusion region FD may overlap the doped isolation pillar 118 in the vertical direction (Z direction). The floating diffusion region FD may cover a top surface of the doped isolation pillar 118. The local isolation film 104 may overlap the doped isolation liner 116 in the vertical direction (Z direction). The local isolation film 104 may cover a top surface of the doped isolation liner 116. Each of the doped isolation liner 116 and the doped isolation pillar 118 may have a less length than each of the outer isolation film 112 and the inner isolation film 114 in the vertical direction (Z direction).

The doped isolation pillar 118 may be spaced apart from the front side surface 120A of the substrate 102 with the floating diffusion region FD therebetween in the vertical direction (Z direction). The doped isolation pillar 118 may have a pillar shape, which extends long from a bottom surface of the floating diffusion region FD to the back side surface 120B of the substrate 102 in the vertical direction (Z direction). The doped isolation liner 116 may be in contact with the sensing area SA of each of the sub-pixels SP1. The doped isolation pillar 118 may be in contact with the sensing area SA of each of the fourth sub-pixels SP1 included in one color unit pixel CP1.

In embodiments, each of the outer isolation film 112 and the plurality of inner isolation films 114 may include silicon oxide, silicon nitride, silicon carbonitride (SiCN), silicon oxynitride (SiON), silicon oxycarbide (SiOC), polysilicon, a metal, a metal nitride, a metal oxide, borosilicate glass (BSG), phosphosilicate glass (PSG), borophosphosilicate glass (BPSG), plasma-enhanced tetraethyl orthosilicate (PE-TEOS), fluoride silicate glass (FSG), carbon doped silicon oxide (CDO), organosilicate glass (OSG), air, or a combination thereof, without being limited thereto. As used herein, the term "air" may refer to gases that may be in the atmosphere or during a manufacturing process. When at least one of the outer isolation film 112 and the plurality of inner isolation films 114 includes a metal, the metal may include tungsten (W), copper (Cu), or a combination thereof. When at least one of the outer isolation film 112 and the plurality of inner isolation films 114 includes a metal nitride, the metal nitride may include titanium nitride (TiN), tantalum nitride (TaN), or a combination thereof. When at least one of the outer isolation film 112 and the plurality of inner isolation films 114 includes a metal oxide, the metal oxide may include indium tin oxide (ITO), aluminum oxide $(Al_2O_3)$, or a combination thereof.

In embodiments, each of the doped isolation liner 116 and the doped isolation pillar 118 may include a silicon region doped with P+-type impurities. For example, each of the doped isolation liner 116 and the doped isolation pillar 118 may include a silicon region doped with boron (B) ions, without being limited thereto.

In embodiments, each of the doped isolation liner 116 and the doped isolation pillar 118 may improve the quality of the image sensor 100 by reducing a dark current in the sub-pixels SP1. The doped isolation liner 116 may reduce the occurrence of dark current due to generation of electron-hole pairs, which are generated from surface defects between the outer isolation film 112 and the doped isolation liner 116 and between the plurality of inner isolation films 114 and the doped isolation liner 116.

As shown in FIGS. 3B and 3C, a wiring structure MS may be on the front side surface 102A of the substrate 102. The wiring structure MS may include interlayer insulating films 182A, 182B, 182C, and 182D, which have a multilayered structure covering a plurality of transfer transistors TX, and a plurality of wiring layers 184, which have a multilayered structure and are respectively formed on the interlayer insulating films 182A, 182B, 182C, and 182D. The number and arrangement of the interlayer insulating films 182A, 182B, 182C, and 182D and the number and arrangement of the wiring layers 184 are not limited to those illustrated in FIGS. 3B and 3C, and various changes and modifications may be made as necessary.

The plurality of wiring layers 184 included in the wiring structure MS may include a plurality of transistors, which are electrically connected to the first to fourth photodiodes PD1, PD2, PD3, and PD4, and wirings connected to the plurality of transistors. Electrical signals converted by the first to fourth photodiodes PD1, PD2, PD3, and PD4 may be signal-processed by the wiring structure MS. The plurality of wiring layers 184 may be freely arranged irrespective of the first to fourth photodiodes PD1, PD2, PD3, and PD4.

A light-transmitting structure LTS may be arranged on the back side surface 102B of the substrate 102. The light-transmitting structure LTS may include a first planarization film 122, a plurality of color filters CF, a second planarization film 124, and a plurality of microlenses ML, which are sequentially stacked on the back side surface 102B. The light-transmitting structure LTS may condense and filter light incident from the outside and provide the condensed and filtered light to the sensing area SA.

The plurality of color filters CF may be arranged to correspond one-to-one to the plurality of sub-pixels SP1, respectively. The plurality of color filters CF may respectively cover the sensing areas SA of the sub-pixels SP1 on the back side surface 102B of the substrate 102. The plurality of color filters CF included in one color unit pixel CP1 may include color filters of the same color.

The plurality of microlenses ML may be arranged to correspond one-to-one to the plurality of sub-pixels SP1, respectively. The plurality of microlenses ML may cover the plurality of sub-pixels SP1 with the plurality of color filters CF therebetween. Each of the first to fourth photodiodes PD1, PD2, PD3, and PD4 may be covered by one microlens ML. Each of the plurality of sub-pixels SP1 may have a back side illumination (BSI) structure that receives light from the back side surface 102B of the substrate 102. The plurality of microlenses ML may have an outwardly convex shape to condense light incident on the first to fourth photodiodes PD1, PD2, PD3, and PD4.

In the light-transmitting structure LTS, the first planarization film 122 may be used as a buffer film configured to prevent the substrate 102 from being damaged during the process of manufacturing the image sensor 100. Each of the first planarization film 122 and the second planarization film 124 may include a silicon oxide film, a silicon nitride film, a resin, or a combination thereof, without being limited thereto.

In embodiments, each of the plurality of color filters CF may include a green color filter, a red color filter, or a blue color filter. In other embodiments, the plurality of color filters CF may include other color filters, such as a cyan color filter, a magenta color filter, and a yellow color filter.

In embodiments, the light-transmitting structure LTS may further include an anti-reflecting film 126 on the first planarization film 122. The anti-reflecting film 126 may overlap the pixel isolation structure 110 in the vertical direction (Z direction) on an edge portion of the sensing area SA. A top surface and a sidewall of the anti-reflecting film 126 may be covered by a color filter CF. The anti-reflecting film 126 may prevent incident light passing through the color filter CF from being laterally reflected or scattered. For example, the anti-reflecting film 126 may prevent photons reflected or scattered at an interface between the color filter CF and the first planarization film 122 from migrating to other sensing areas SA. In embodiments, the anti-reflecting film 126 may include a metal. For example, the anti-reflecting film 126 may include tungsten (W), aluminum (Al), copper (Cu), or a combination thereof, without being limited thereto.

As shown in FIGS. 3B and 3C, each of the first to fourth photodiodes PD1, PD2, PD3, and PD4 may include a first semiconductor region 132, a second semiconductor region 134, and a junction between the first semiconductor region 132 and the second semiconductor region 134. The first semiconductor region 132 may be a semiconductor region doped with P-type impurities and arranged adjacent to the front side surface 102A of the substrate 102. The first semiconductor region 132 may be used as a hole accumulated device (HAD) region. A dopant concentration of the first semiconductor region 132 may be higher than a dopant concentration of a P-type semiconductor layer included in the substrate 102. The second semiconductor region 134 may be a semiconductor region doped with N-type impurities. The second semiconductor region 134 may be spaced apart from the front side surface 102A of the substrate 102 with the first semiconductor region 132 therebetween and may be in contact with the first semiconductor region 132.

As shown in FIG. 3B, a transfer transistor TX included in one sub-pixel SP1 may include a gate dielectric film 142, a transfer gate 144, and a channel region CH. The channel region CH may be adjacent to the gate dielectric film 142 in the substrate 102. On the front side surface 102A of the substrate 102, sidewalls of each of the gate dielectric film 142 and the transfer gate 144 may be covered by insulating spacers 146. In embodiments, the gate dielectric film 142 may include a silicon oxide film. In embodiments, the transfer gate 144 may include at least one of doped polysilicon, a metal, a metal silicide, a metal nitride, and a metal-containing film. For example, the transfer gate 144 may include polysilicon doped with N-type impurities, such as phosphorus (P) and arsenic (As). In embodiments, each of the insulating spacers 140 may include a silicon oxide film, a silicon nitride film, a silicon oxynitride film, or a combination thereof. However, a constituent material of each of the gate dielectric film 142, the transfer gate 144, and the insulating spacers 146 is not limited to the examples described above and may be variously modified within the scope of the inventive concept.

The transfer gate 144 of each of the plurality of transfer transistors TX may transmit photocharges generated by a selected one of the first to fourth photodiodes PD1, PD2, PD3, and PD4 to the floating diffusion region FD. The present embodiment pertains to an example in which each of the plurality of transfer transistors TX has a recess-channel transistor structure in which a portion of the transfer gate 144 is buried in the substrate 102 from the front side surface 102A of the substrate 102. However, the inventive concept is not limited thereto, and a transfer transistor having various structures may be adopted within the scope of the inventive concept.

In the sensing area SA of each of the plurality of sub-pixels SP1, the first to fourth photodiodes PD1, PD2, PD3, and PD4 may generate photocharges by receiving light transmitted through one microlens ML covering the back side surface 102B of the substrate 102, and the generated photocharges may be accumulated in the first to fourth photodiodes PD1, PD2, PD3, and PD4 to generate the first to fourth pixel signals. In the plurality of sub-pixels SP1, auto-focusing information may be extracted from the first to fourth pixel signals output by the first to fourth photodiodes PD1, PD2, PD3, and PD4.

The image sensor 100 described with reference to FIGS. 1, 2, and 3A to 3D may include the pixel isolation structure 110 configured to isolate the plurality of sub-pixels SP1 included in the color unit pixel CP1 from each other. The pixel isolation structure 110 may include the outer isolation film 112 surrounding the color unit pixel CP1, the plurality of inner isolation films 114, each of which includes the portion between two adjacent ones of the plurality of sub-pixels SP1 in the area defined by the outer isolation film 112, the doped isolation liner 116 covering opposite sidewalls of each of the plurality of inner isolation films 114, and the doped isolation pillar 118 in contact with the plurality of sub-pixels SP1 included in one color unit pixel CP1. The doped isolation pillar 118 may define the size of the partial region of each of the plurality of sub-pixels SP1 along with the plurality of inner isolation films 114. The doped isolation pillar 118 may include a silicon region doped with P+-type impurities. During the manufacture of the image sensor 100, processes of forming the outer isolation film 112 and the plurality of inner isolation films 114 may be performed separately from a process of forming the doped isolation pillar 118. In the image sensor 100 including the doped isolation pillar 118, even when an aspect ratio of each of a plurality of sensing areas SA is relatively high, when processes required to form the pixel isolation structure 110 are performed during the manufacture of the image sensor 100, a local area (e.g., a local area LA shown in FIG. 12A) of the substrate 102, which is required to form the doped isolation pillar 118, may support the plurality of sensing areas SA. Therefore, the occurrence of undesired process failures (e.g., undesired leaning or collapse of patterns for forming a plurality of sensing areas SA) may be prevented during the manufacture of the image sensor 100, and the sensitivity and resolution of the image sensor 100 may be improved.

Figure 4:
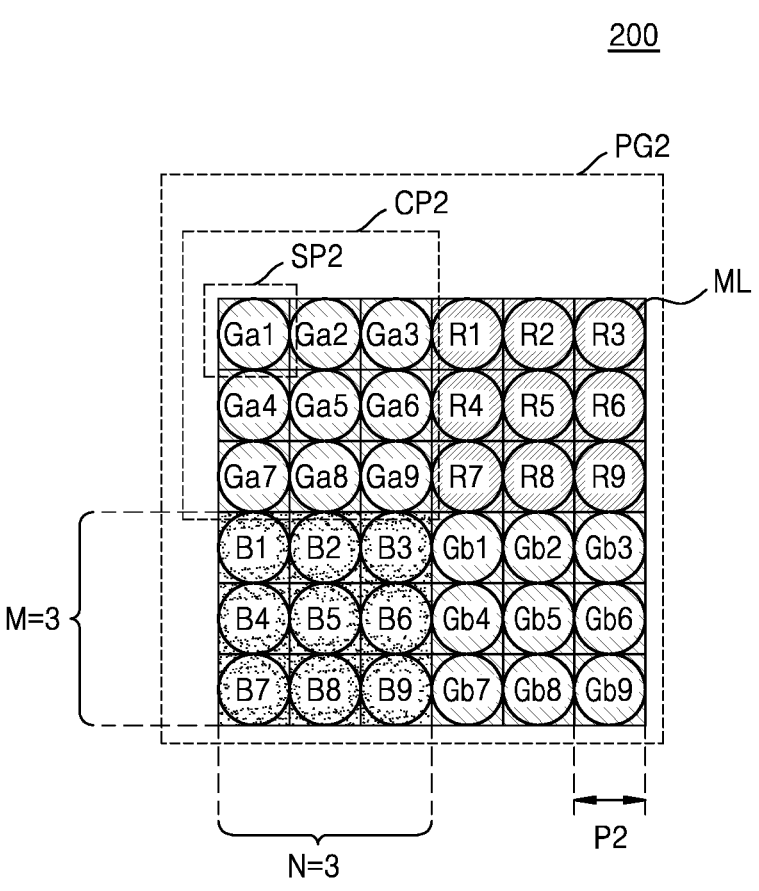
FIG. 4 is a diagram of an example of a pixel group that may be included in an image sensor according to embodiments.

FIG. 4 is a diagram of an image sensor 200 according to embodiments, and an example of a pixel group PG2 that may be included in the image sensor 200 is illustrated in FIG. 4. In FIG. 4, the same reference numerals are used to denote the same elements as in FIG. 2.

Referring to FIG. 4, the image sensor 200 may have substantially the same configuration as the image sensor 100 described with reference to FIGS. 1, 2, and 3A to 3D. However, the image sensor 200 may include a pixel group PG2 instead of the pixel group PG1 shown in FIG. 2 as the pixel group PG described with reference to FIG. 1.

The pixel group PG2 may include four color unit pixels CP2 that form a Bayer pattern including red, green, and blue colors. Each of a plurality of color unit pixels CP2 may include nine sub-pixels SP2 arranged in a 3×3 matrix. The pixel group PG2 may include a first green color unit pixel including nine first green sub-pixels Ga1, Ga2, Ga3, Ga4, Ga5, Ga6, Ga7, Ga8, and Ga9 arranged in a 3×3 matrix, a first red color unit pixel including nine red sub-pixels R1, R2, R3, R4, R5, R6, R7, R8, and R9 arranged in a 3×3 matrix, a blue color unit pixel including nine blue sub-pixels B1, B2, B3, B4, B5, B6, B7, B8, and B9 arranged in a 3×3 matrix, and a second green color unit pixel including nine second green sub-pixels Gb1, Gb2, Gb3, Gb4, Gb5, Gb6, Gb7, Gb8, and Gb9 arranged in a 3×3 matrix. One color unit pixel CP2 may include nine microlenses ML covering the nine sub-pixels SP2. The nine microlenses ML may be arranged to correspond one-to-one to the nine sub-pixels SP2, respectively. The pixel group PG2 having the arrangement shown in FIG. 4 may be referred to as a nona cell. The pixel group PG2 may include two green color unit pixels, one red color unit pixel, and one blue color unit pixel. One color unit pixel CP2 may include nine sub-pixels SP2 having the same color information (i.e., emitting lights via color filters of the same color). In embodiments, in the pixel group PG2, the plurality of sub-pixels SP2 may be arranged at a pitch P2 of less than about 1 μm, for example, less than about 0.8 μm or less than about 0.64 μm, without being limited thereto. In embodiments, an aspect ratio of a sensing area SA included in each of the plurality of sub-pixels SP2 may be selected in a range of about 10:1 to about 80:1, without being limited thereto.

Although FIG. 4 illustrates a case in which each of the plurality of color unit pixels CP2 has a nona-cell structure including nine sub-pixels arranged in a 3×3 matrix, the inventive concept is not limited thereto. The color unit pixel CP2 may include a plurality of sub-pixels arranged in an m×n matrix. Herein, each of m and n may be a natural number of at least 2, for example, a natural number of 2 to 10.

Figure 5:
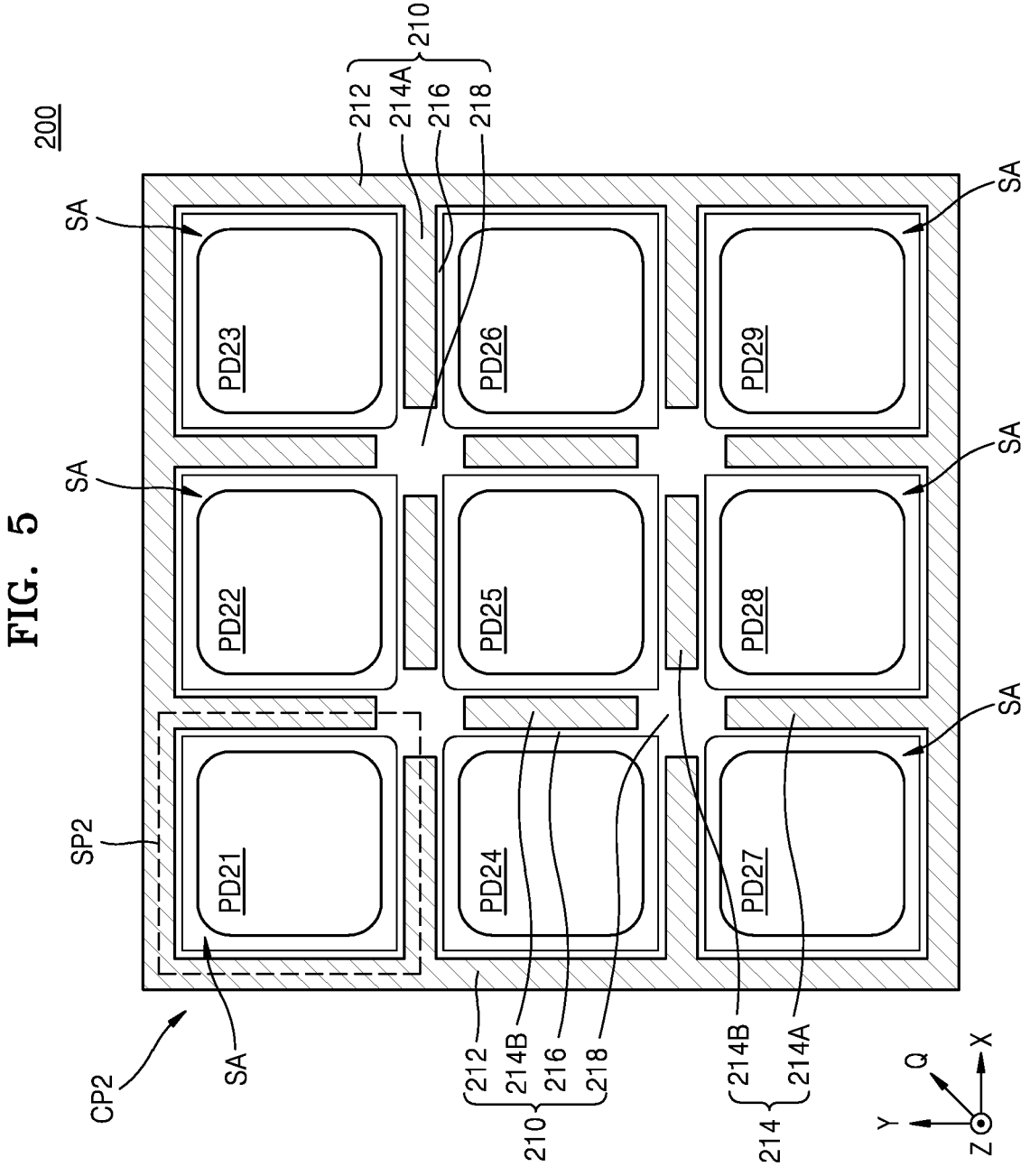
FIG. 5 is a detailed plan view of a configuration of the image sensor shown in FIG. 4.

FIG. 5 is a detailed plan view of a configuration of the image sensor 200 shown in FIG. 4. FIG. 5 illustrates some components of the image sensor 200 at a vertical level corresponding to the vertical level LV1 shown in FIGS. 3A and 3B. An example configuration of a color unit pixel CP2 included in the image sensor 200 will be described with reference to FIG. 5. In FIG. 5, the same reference numerals are used to denote the same elements as in FIGS. 3A to 3D, and detailed descriptions thereof are omitted.

Referring to FIG. 5, the image sensor 200 may have substantially the same configuration as the image sensor 100 described with reference to FIGS. 3A to 3D. However, the image sensor 200 may include the color unit pixel CP2 including nine sub-pixels SP2 arranged in a 3×3 matrix and a pixel isolation structure 210 configured to isolate the nine sub-pixels SP2 from each other in the color unit pixel CP2. The nine sub-pixels SP2 included in one color unit pixel CP2 may include pixels emitting lights via color filters of the same color.

The color unit pixel CP2 may include a plurality of photodiodes, which are respectively arranged one-by-one in a plurality of sub-pixels SP2. The plurality of photodiodes may include first to ninth photodiodes PD21, PD22, PD23, PD24, PD25, PD26, PD27, PD28, and PD29. One sub-pixel SP2 may include a selected one of the first to ninth photodiodes PD21, PD22, PD23, PD24, PD25, PD26, PD27, PD28, and PD29.

The pixel isolation structure 210 may be configured such that the plurality of sub-pixels SP1 are isolated from each other in the color unit pixel CP1. The pixel isolation structure 210 may include an outer isolation film 212, a plurality of inner isolation films 214, a doped isolation liner 216, and a doped isolation pillar 218.

The outer isolation film 212, the plurality of inner isolation films 214, the doped isolation liner 216, and a plurality of doped isolation pillars 218, which constitute the pixel isolation structure 210, may substantially have the same configurations as the outer isolation film 112, the plurality of inner isolation films 114, the doped isolation liner 116, and the doped isolation pillar 118, which have been described with reference to FIGS. 3A to 3D. However, the plurality of inner isolation films 214 may include a plurality of first inner isolation films 214A and a plurality of second inner isolation films 214B. The plurality of first inner isolation films 214A may be integrally connected to the outer isolation film 212. The plurality of second inner isolation films 214B may be spaced apart from the outer isolation film 212 and the plurality of first inner isolation films 214A in a lateral direction (e.g., X direction or Y direction). The pixel isolation structure 210 may include four doped isolation pillars 218 that are apart from each other.

In the pixel isolation structure 210, each of the four doped isolation pillars 218 may be in contact with a sensing area SA of each of the four sub-pixels SP2, which are selected from the nine sub-pixels SP2 included in one color unit pixel CP2. The plurality of first inner isolation films 214A may be between two sub-pixels SP2, which are selected from the nine sub-pixels SP2 included in one color unit pixel CP2, and may be integrally connected to the outer isolation film 212. Each of the plurality of second inner isolation films 214B may be between two sub-pixels SP2, which are selected from the nine sub-pixels SP2, and may be spaced apart from the first inner isolation film 214A with the doped isolation pillar 218 therebetween in a lateral direction.

The doped isolation liner 216 may be integrally connected to the plurality of doped isolation pillars 218. Similarly to the doped isolation pillar 118 described with reference to FIG. 3B, each of the plurality of doped isolation pillars 218 may have a pillar shape, which passes through a portion of a substrate (refer to 102 in FIG. 3B) and extends long to a back side surface 120B of the substrate 102 in a vertical direction (Z direction). Although not shown, the image sensor 200 may further include a floating diffusion region (refer to FD in FIG. 3B), which overlaps at least some of the plurality of doped isolation pillars 218 in the vertical direction (Z direction). For example, FIG. 5 shows four doped isolation pillars 218 and four floating diffusion regions. Each floating diffusion region may overlap a corresponding doped isolation pillar among the four doped isolation pillars 218.

In embodiments, each of the doped isolation liner 216 and the plurality of doped isolation pillars 218 may include a silicon region doped with P+-type impurities. In embodiments, each of the doped isolation liner 216 and the plurality of doped isolation pillars 218 may improve the quality of the image sensor 200 by reducing a dark current in the sub-pixels SP2. The doped isolation liner 216 may reduce the occurrence of dark current due to generation of electron-hole pairs, which are generated from surface defects between the outer isolation film 212 and the doped isolation liner 216 and between the plurality of inner isolation films 214 and the doped isolation liner 216.

The image sensor 200 described with reference to FIGS. 4 and 5 may include the pixel isolation structure 210 configured to isolate the plurality of sub-pixels SP included in the color unit pixel CP2 from each other. The pixel isolation structure 210 may include the outer isolation film 212 surrounding the color unit pixel CP2, the plurality of inner isolation films 214, each of which includes a portion between two adjacent ones of the plurality of sub-pixels SP2 in an area defined by the outer isolation film 212, a doped isolation liner 216 covering opposite sidewalls of each of the plurality of inner isolation films 214, and the plurality of doped isolation pillars 218 in contact with the plurality of sub-pixels SP2 included in one color unit pixel CP2. The plurality of doped isolation pillars 218 may define a size of a partial region of each of the plurality of sub-pixels SP2 along with the plurality of inner isolation films 214. The plurality of doped isolation pillars 218 may include a silicon region doped with P+-type impurities. During the manufacture of the image sensor 200, processes of forming the outer isolation film 212 and the plurality of inner isolation films 214 may be performed separately from a process of forming the doped isolation pillar 218. Therefore, even when an aspect ratio of each of a plurality of sensing areas SA is relatively high, processes required to form the pixel isolation structure 210 may be performed during the manufacture of the image sensor 200 without causing occurrence of process failures (e.g., undesired leaning or collapse of patterns for forming a plurality of sensing areas SA), and resolution of the image sensor 200 may be improved.

Figure 6:
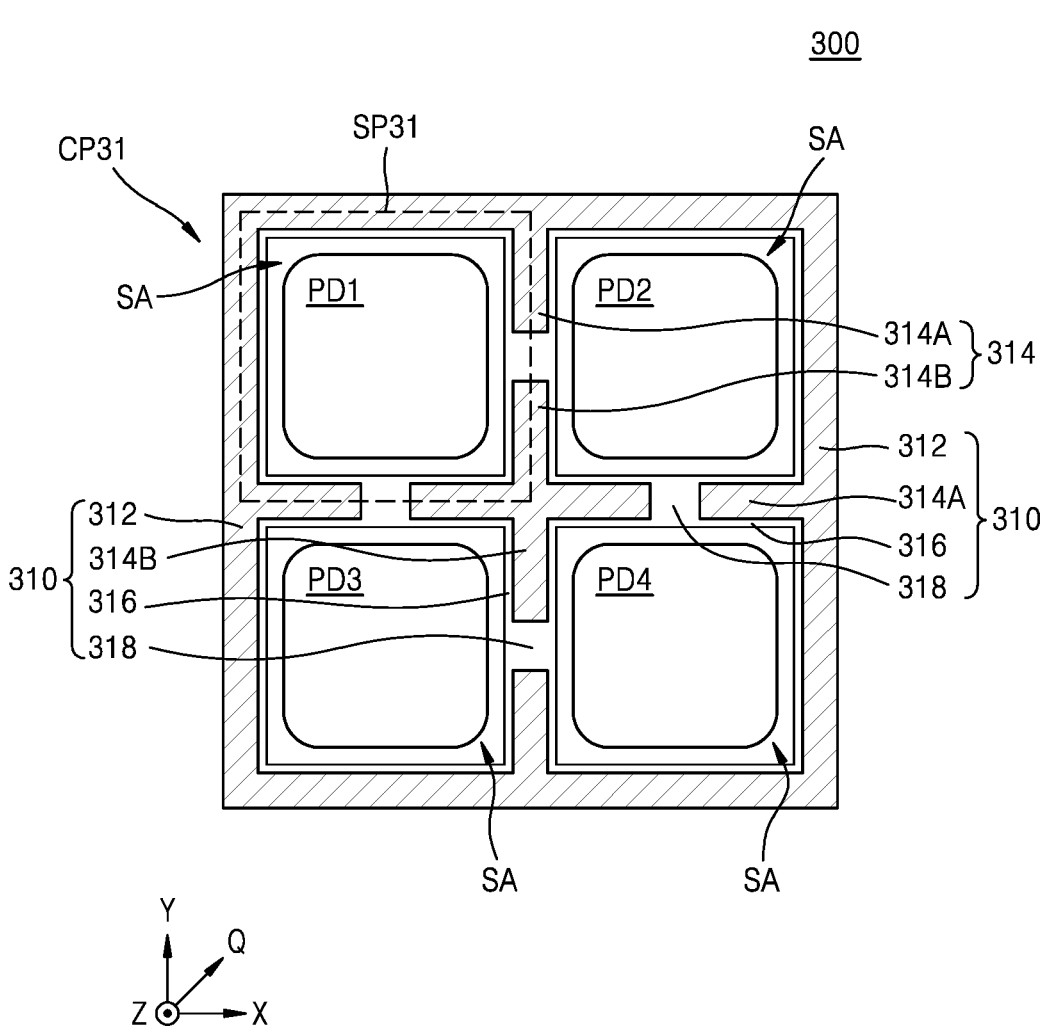
FIG. 6 is a plan view of an image sensor according to embodiments.

FIG. 6 is a plan view of an image sensor 300 according to embodiments. FIG. 6 illustrates some components of the image sensor 300 at a vertical level corresponding to the vertical level LV1 shown in FIGS. 3A and 3B. An example configuration of a color unit pixel CP31 included in the image sensor 300 will be described with reference to FIG. 6. In FIG. 6, the same reference numerals are used to denote the same elements as in FIGS. 3A to 3D, and detailed descriptions thereof are omitted.

Referring to FIG. 6, the image sensor 300 may have substantially the same configuration as the image sensor 100 described with reference to FIGS. 3A to 3D. However, the image sensor 300 may include the color unit pixel CP31 including four sub-pixels SP31 arranged in a 2×2 matrix and a pixel isolation structure 310 configured to isolate the four sub-pixels SP31 from each other in the color unit pixel CP31.

Each of the four sub-pixels SP31 included in one color unit pixel CP31 may include a sensing area SA defined by the pixel isolation structure 310. The sensing area SA may be a region configured to sense light incident from the outside of the sub-pixels SP31. The four sub-pixels SP31 included in one color unit pixel CP31 may include pixels emitting lights via color filters of the same color.

The pixel isolation structure 310 may be configured such that a plurality of sub-pixels SP31 are isolated from each other in the color unit pixel CP31. The pixel isolation structure 310 may include an outer isolation film 312, a plurality of inner isolation films 314, a doped isolation liner 316, and a doped isolation pillar 318.

The outer isolation film 312, the plurality of inner isolation films 314, the doped isolation liner 316, and a plurality of doped isolation pillars 318, which constitute the pixel isolation structure 310, may substantially have the same configurations as the outer isolation film 112, the plurality of inner isolation films 114, the doped isolation liner 116, and the doped isolation pillar 118, which have been described with reference to FIGS. 3A to 3D. However, the plurality of inner isolation films 314 may include a plurality of first inner isolation films 314, which are integrally connected to the outer isolation film 312, and the second inner isolation film 314B, which are spaced apart from the outer isolation film 312 and the plurality of first inner isolation films 314A in a lateral direction (e.g., X direction or Y direction). The pixel isolation structure 310 may include four doped isolation pillars 318 that are apart from each other. Each of the four doped isolation pillars 318 may be spaced apart from the outer isolation film 312 with the inner isolation film 314 therebetween in a lateral direction.

The plurality of inner isolation films 314 may include four first inner isolation films 314A and one second inner isolation film 314B. The second inner isolation film 314B may be approximately in the center of the color unit pixel CP31. The second inner isolation film 314B may have a cross shape in a view from an X-Y plane. As used herein, the second inner isolation film 314B may also be referred to as a cross-shaped inner isolation film. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In the pixel isolation structure 310, each of the four doped isolation pillars 318 may be in contact with the sensing area SA of each of two sub-pixels SP31, which are selected from the four sub-pixels SP31 included in one color unit pixel CP31. The plurality of first inner isolation films 314A may be between two sub-pixels SP31, which are selected from the four sub-pixels SP31 included in one color unit pixel CP31, and may be integrally connected to the outer isolation film 312. The second inner isolation film 314B may include portions between two sub-pixels SP31, which are selected from the four sub-pixels SP31. The second inner isolation film 314B may be spaced apart from the first inner isolation film 314A with the doped isolation pillar 318 therebetween in the lateral direction.

The doped isolation liner 316 may be integrally connected to the doped isolation pillar 318. Similarly to the doped isolation pillar 118 described with reference to FIG. 3B, the doped isolation pillar 318 may have a pillar shape, which passes through a portion of a substrate (refer to 102 in FIG. 3B) and extends long to a back side surface 120B of the substrate 102 in a vertical direction (Z direction). Although not shown, the image sensor 300 may further include a floating diffusion region (refer to FD in FIG. 3B), which overlaps at least some of the plurality of doped isolation pillars 318 in the vertical direction (Z direction).

In embodiments, each of the doped isolation liner 316 and the plurality of doped isolation pillars 318 may include a silicon region doped with P+-type impurities. For example, each of the doped isolation liner 316 and the plurality of doped isolation pillars 318 may include a silicon region doped with boron (B) ions, without being limited thereto.

In embodiments, each of the doped isolation liner 316 and the plurality of doped isolation pillars 318 may improve the quality of the image sensor 300 by reducing a dark current in the sub-pixels SP31. The doped isolation liner 316 may reduce the occurrence of dark current due to generation of electron-hole pairs, which are generated from surface defects between the outer isolation film 312 and the doped isolation liner 316 and between the plurality of inner isolation films 314 and the doped isolation liner 316.

Figure 7:
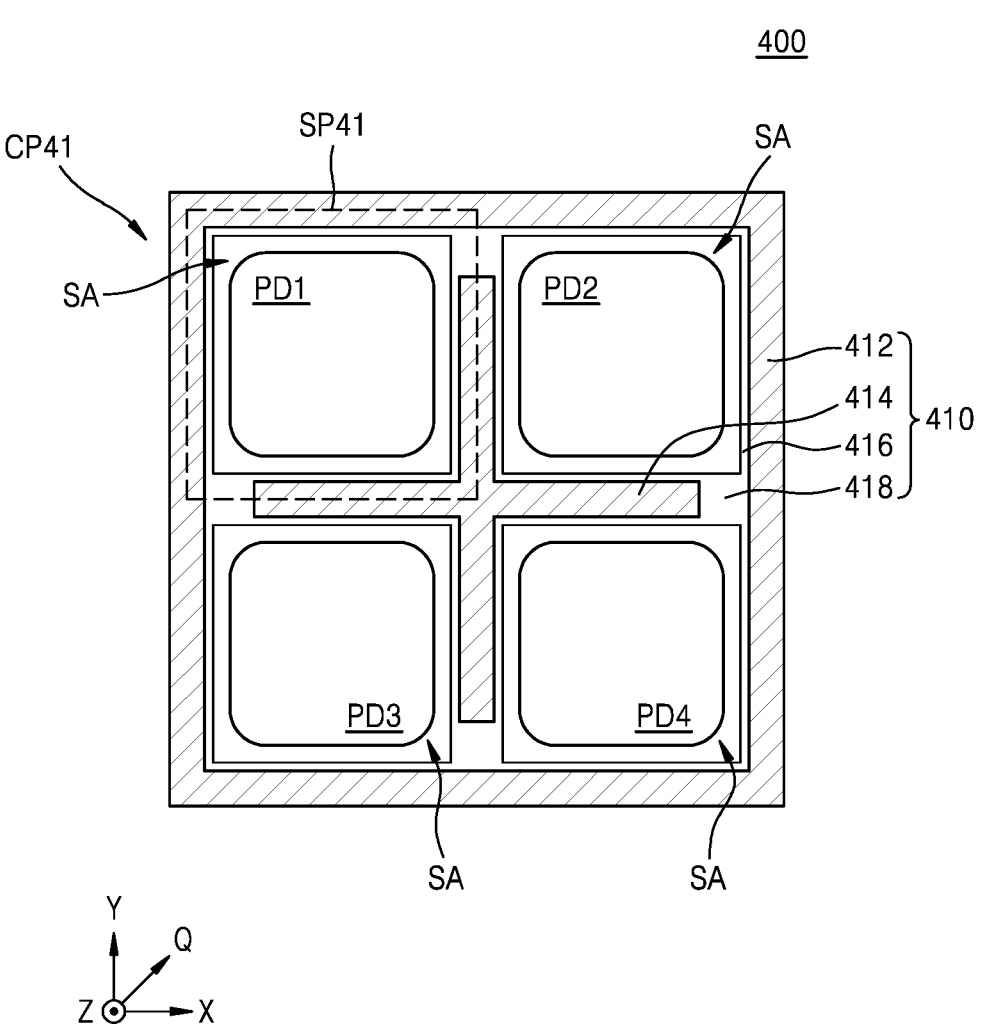
FIG. 7 is a plan view of an image sensor according to embodiments.

FIG. 7 is a plan view of an image sensor 400 according to embodiments. FIG. 7 illustrates some components of the image sensor 400 at a vertical level corresponding to the vertical level LV1 shown in FIGS. 3A and 3B. An example configuration of a color unit pixel CP41 included in the image sensor 400 will be described with reference to FIG. 7. In FIG. 7, the same reference numerals are used to denote the same elements as in FIGS. 3A to 3D, and detailed descriptions thereof are omitted.

Referring to FIG. 7, the image sensor 400 may have substantially the same configuration and provide substantially the same effects as the image sensor 100 described with reference to FIGS. 3A to 3D. However, the image sensor 400 may include the color unit pixel CP41 including four sub-pixels SP41 arranged in a 2×2 matrix and a pixel isolation structure 410 configured to isolate the four sub-pixels SP41 from each other in the color unit pixel CP41.

Each of the four sub-pixels SP41 included in one color unit pixel CP41 may include a sensing area SA defined by the pixel isolation structure 410. The sensing area SA may be a region configured to sense light incident from the outside of the sub-pixels SP41. The four sub-pixels SP41 included in one color unit pixel CP41 may include pixels emitting lights via color filters of the same color.

The pixel isolation structure 410 may isolate a plurality of sub-pixels SP41 in the color unit pixel CP41. The pixel isolation structure 410 may include an outer isolation film 412, a plurality of inner isolation films 414, a doped isolation liner 416, and a doped isolation pillar 418.

The outer isolation film 412, the inner isolation film 414, the doped isolation liner 416, and a plurality of doped isolation pillars 418, which constitute the pixel isolation structure 410, may substantially have the same configurations as the outer isolation film 112, the plurality of inner isolation films 114, the doped isolation liner 116, and the doped isolation pillar 118, which have been described with reference to FIGS. 3A to 3D. However, the inner isolation film 414 may be spaced apart from the outer isolation film 412 in a lateral direction (e.g., X direction or Y direction). The pixel isolation structure 410 may include four doped isolation pillars 418 that are spaced apart from each other. Each of the four doped isolation pillars 418 may be in contact with the outer isolation film 312.

The inner isolation film 414 may be approximately in the center of the color unit pixel CP41. The inner isolation film 414 may have a cross shape in a view from an X-Y plane. As used herein, the inner isolation film 414 may also be referred to as a cross-shaped inner isolation film.

In the pixel isolation structure 410, each of the four doped isolation pillars 418 may be in contact with the sensing area SA of each of two sub-pixels SP41, which are selected from the four sub-pixels SP41 included in one color unit pixel CP41. Each of the four doped isolation pillars 418 included in the pixel isolation structure 410 may be in contact with the outer isolation film 412.

The inner isolation film 414 of the pixel isolation structure 410 may include portions between two sub-pixels SP41, which are selected from the four sub-pixels SP41 included in one color unit pixel CP41. The inner isolation film 414 may be spaced apart from the outer isolation film 412 with the doped isolation pillar 418 therebetween in a lateral direction.

The doped isolation liner 416 may be integrally connected to the doped isolation pillar 418. Similarly to the doped isolation pillar 118 described with reference to FIG. 3B, the doped isolation pillars 418 may have a pillar shape, which passes through a portion of a substrate (refer to 102 in FIG. 3B) and extends long to a back side surface 120B of the substrate 102 in a vertical direction (Z direction). Although not shown, the image sensor 400 may further include a floating diffusion region (refer to FD in FIG. 3B), which overlaps at least some of the plurality of doped isolation pillars 418 in the vertical direction (Z direction).

In embodiments, each of the doped isolation liner 416 and the doped isolation pillar 418 may include a silicon region doped with P+-type impurities. For example, each of the doped isolation liner 416 and the doped isolation pillar 418 may include a silicon region doped with boron (B) ions, without being limited thereto.

In embodiments, each of the doped isolation liner 416 and the doped isolation pillar 418 may improve the quality of the image sensor 400 by reducing a dark current in the sub-pixels SP41. The doped isolation liner 416 may reduce the occurrence of dark current due to generation of electron-hole pairs, which are generated from surface defects between the outer isolation film 412 and the doped isolation liner 416 and between the inner isolation film 414 and the doped isolation liner 416.

Figure 8:
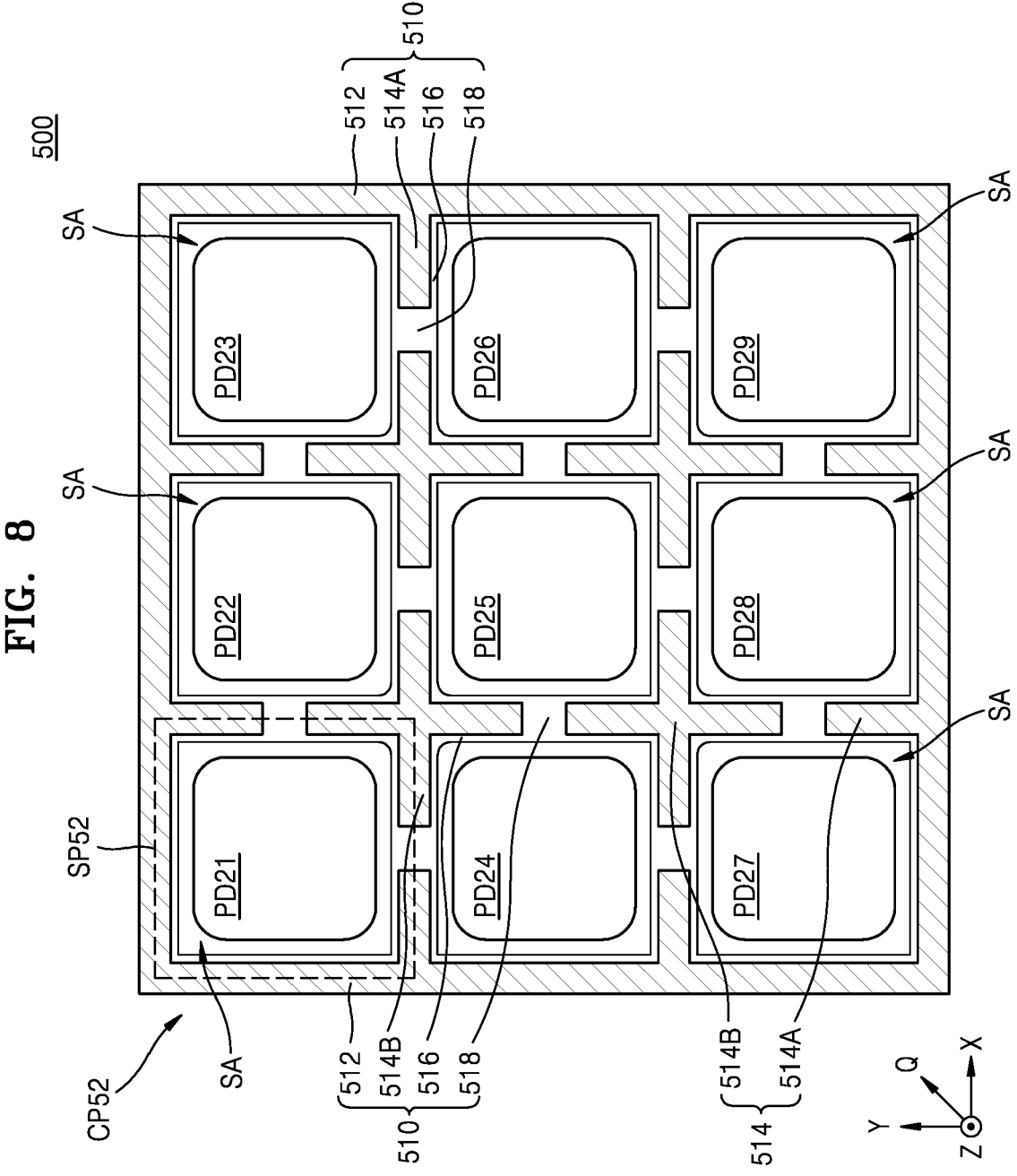
FIG. 8 is a plan view of an image sensor according to embodiments.

FIG. 8 is a plan view of an image sensor 500 according to embodiments. FIG. 8 illustrates some components of the image sensor 500 at a vertical level corresponding to the vertical level LV1 shown in FIGS. 3A and 3B. An example configuration of a color unit pixel CP52 included in the image sensor 500 will be described with reference to FIG. 8. In FIG. 8, the same reference numerals are used to denote the same elements as in FIG. 5, and detailed descriptions thereof are omitted.

Referring to FIG. 8, the image sensor 500 may have substantially the same configuration and provide substantially the same effects as the image sensor 200 described with reference to FIG. 5. However, the image sensor 500 may include the color unit pixel CP52 including nine sub-pixels SP52 arranged in a 3×3 matrix and a pixel isolation structure 510 configured to isolate the nine sub-pixels SP52 from each other in the color unit pixel CP52. The nine sub-pixels SP52 included in one color unit pixel CP52 may include pixels emitting lights via color filters of the same color.

The pixel isolation structure 510 may be configured such that a plurality of sub-pixels SP52 are isolated from each other in the color unit pixel CP52. The pixel isolation structure 510 may include an outer isolation film 512, a plurality of inner isolation films 514, a doped isolation liner 516, and a doped isolation pillar 518.

The outer isolation film 512, the plurality of inner isolation films 514, the doped isolation liner 516, and a plurality of doped isolation pillars 518, which constitute the pixel isolation structure 510, may substantially have the same configurations as the outer isolation film 112, the plurality of inner isolation films 114, the doped isolation liner 116, and the doped isolation pillar 118, which have been described with reference to FIGS. 3A to 3D. However, the plurality of inner isolation films 514 may include a plurality of first inner isolation films 514A and a plurality of second inner isolation films 514B. The plurality of first inner isolation films 514A may be integrally connected to the outer isolation film 512. The plurality of second inner isolation films 514B may be spaced apart from the outer isolation film 512 and the plurality of first inner isolation films 514A in a lateral direction (e.g., X direction or Y direction). Each of the plurality of second inner isolation films 514B may have a cross shape in a view from an X-Y plane. As used herein, the second inner isolation film 514B may also be referred to as a cross-shaped inner isolation film. The pixel isolation structure 510 may include ten doped isolation pillars 518 that are spaced apart from each other. Each of the ten doped isolation pillars 518 may be spaced apart from the outer isolation film 512 with the first inner isolation film 514A therebetween in a lateral direction.

In the pixel isolation structure 510, each of the ten doped isolation pillars 518 may be in contact with a sensing area SA of each of two sub-pixels SP52, which are selected from the nine sub-pixels SP52 included in one color unit pixel CP52. The plurality of first inner isolation films 514A may be between two sub-pixels SP52, which are selected from the nine sub-pixels SP52 included in the one color unit pixel CP52, and may be integrally connected to the outer isolation film 512. Each of the plurality of second inner isolation films 514B may include portions between two sub-pixels SP52, which are selected from the nine sub-pixels SP52. Each of the plurality of second inner isolation films 514B may be spaced apart from the first inner isolation film 514A with the doped isolation pillar 518 therebetween in the lateral direction. Each of the plurality of second inner isolation films 514B may have a cross shape in a view from an X-Y plane. As used herein, the second inner isolation film 514B may also be referred to as a cross-shaped inner isolation film. The pixel isolation structure 510 may include four second inner isolation films 514B that are spaced apart from each other.

The doped isolation liner 516 may be integrally connected to the plurality of doped isolation pillars 518. Similarly to the doped isolation pillar 118 described with reference to FIG. 3B, each of the plurality of doped isolation pillars 518 may have a pillar shape, which passes through a portion of a substrate (refer to 102 in FIG. 3B) and extends long to a back side surface 120B of the substrate 102 in a vertical direction (Z direction). Although not shown, the image sensor 500 may further include a floating diffusion region (refer to FD in FIG. 3B), which overlaps at least some of the plurality of doped isolation pillars 518 in the vertical direction (Z direction).

In embodiments, each of the doped isolation liner 516 and the plurality of doped isolation pillars 518 may include a silicon region doped with P+-type impurities. For example, each of the doped isolation liner 516 and the plurality of doped isolation pillars 518 may include a silicon region doped with boron (B) ions, without being limited thereto.

In embodiments, each of the doped isolation liner 516 and the plurality of doped isolation pillars 518 may improve the quality of the image sensor 500 by reducing a dark current in the sub-pixels SP52. The doped isolation liner 516 may reduce the occurrence of dark current due to generation of electron-hole pairs, which are generated from surface defects between the outer isolation film 512 and the doped isolation liner 516 and between the plurality of inner isolation films 514 and the doped isolation liner 516.

Figure 9:
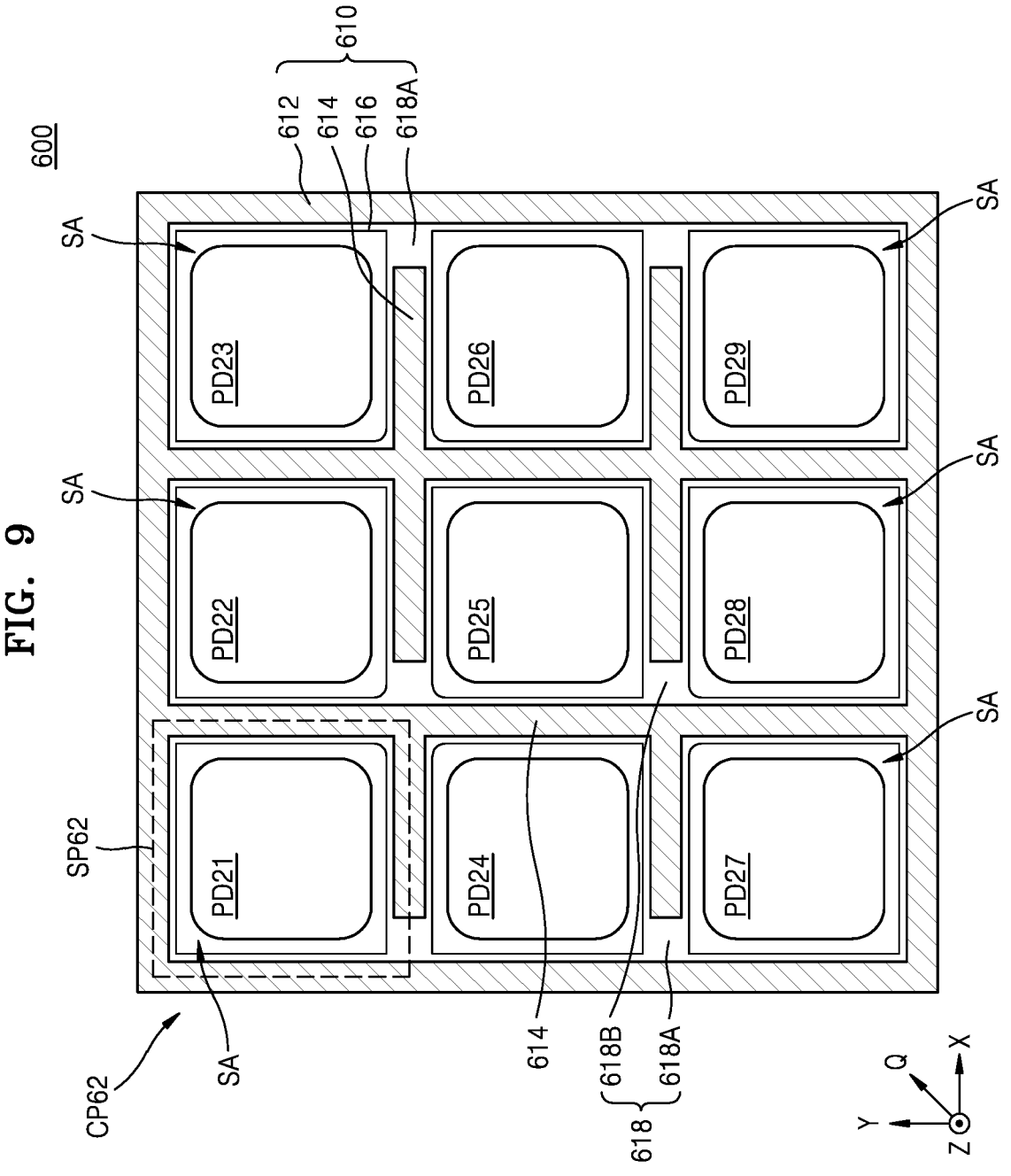
FIG. 9 is a plan view of an image sensor according to embodiments.

FIG. 9 is a plan view of an image sensor 600 according to embodiments. FIG. 9 illustrates some components of the image sensor 600 at a vertical level corresponding to the vertical level LV1 shown in FIGS. 3B and 3C. An example configuration of a color unit pixel CP62 included in the image sensor 600 will be described with reference to FIG. 9. In FIG. 9, the same reference numerals are used to denote the same elements as in FIG. 5, and detailed descriptions thereof are omitted.

Referring to FIG. 9, the image sensor 600 may have substantially the same configuration and provide substantially the same effects as the image sensor 200 described with reference to FIG. 5. However, the image sensor 600 may include the color unit pixel CP62 including nine sub-pixels SP62 arranged in a 3×3 matrix and a pixel isolation structure 610 configured to isolate the nine sub-pixels SP62 from each other in the color unit pixel CP62. The nine sub-pixels SP62 included in one color unit pixel CP62 may include pixels emitting lights via color filters of the same color.

The pixel isolation structure 610 may be configured such that a plurality of sub-pixels SP62 are isolated from each other in the color unit pixel CP62. The pixel isolation structure 610 may include an outer isolation film 612, a plurality of inner isolation films 614, a doped isolation liner 616, and a doped isolation pillar 618.

The outer isolation film 612, the plurality of inner isolation films 614, the doped isolation liner 616, and a plurality of doped isolation pillars 618, which constitute the pixel isolation structure 610, may substantially have the same configurations as the outer isolation film 112, the plurality of inner isolation films 114, the doped isolation liner 116, and the doped isolation pillar 118, which have been described with reference to FIGS. 3A to 3D. However, the plurality of doped isolation pillars 618 may include a plurality of first doped isolation pillars 618A and a plurality of second doped isolation pillars 618B. The plurality of first doped isolation pillars 618A may be in contact with the outer isolation film 612. The plurality of second doped isolation pillars 618B may be spaced apart from the outer isolation film 612 in a lateral direction (e.g., X direction or Y direction).

The plurality of inner isolation films 614 may be integrally connected to the outer isolation film 512 and have respectively different plane shapes. Some of the plurality of inner isolation films 614 may have a cross-shaped portion in a view from an X-Y plane. Others of the plurality of inner isolation films 614 may have a T-shaped portion in the view from the X-Y plane.

The pixel isolation structure 610 may include six doped isolation pillars 618 that are spaced apart from each other. In the pixel isolation structure 610, each of the six doped isolation pillars 618 may be in contact with a sensing area SA of each of two sub-pixels SP52, which are selected from the nine sub-pixels SP62 included in one color unit pixel CP62. The plurality of inner isolation films 614 may include portions between two sub-pixels SP62, which are selected from the nine sub-pixels SP62 included in one color unit pixel CP62. Each of the plurality of inner isolation films 614 may include a plurality of end portions integrally connected to the outer isolation film 512.

The doped isolation liner 616 may be integrally connected to the plurality of doped isolation pillars 618. Similarly to the doped isolation pillar 118 described with reference to FIG. 3B, each of the plurality of doped isolation pillars 618 may have a pillar shape, which passes through a portion of a substrate (refer to 102 in FIG. 3B) and extends long to a back side surface 120B of the substrate 102 in a vertical direction (Z direction). Although not shown, the image sensor 600 may further include a floating diffusion region (refer to FD in FIG. 3B), which overlaps at least some of the plurality of doped isolation pillars 618 in the vertical direction (Z direction).

In embodiments, each of the doped isolation liner 616 and the plurality of doped isolation pillars 618 may include a silicon region doped with P+-type impurities. For example, each of the doped isolation liner 616 and the plurality of doped isolation pillars 618 may include a silicon region doped with boron (B) ions, without being limited thereto.

In embodiments, each of the doped isolation liner 616 and the plurality of doped isolation pillars 618 may improve the quality of the image sensor 600 by reducing a dark current in the sub-pixels SP62. The doped isolation liner 616 may reduce the occurrence of dark current due to generation of electron-hole pairs, which are generated from surface defects between the outer isolation film 612 and the doped isolation liner 616 and between the plurality of inner isolation films 614 and the doped isolation liner 616.

Figure 10A:
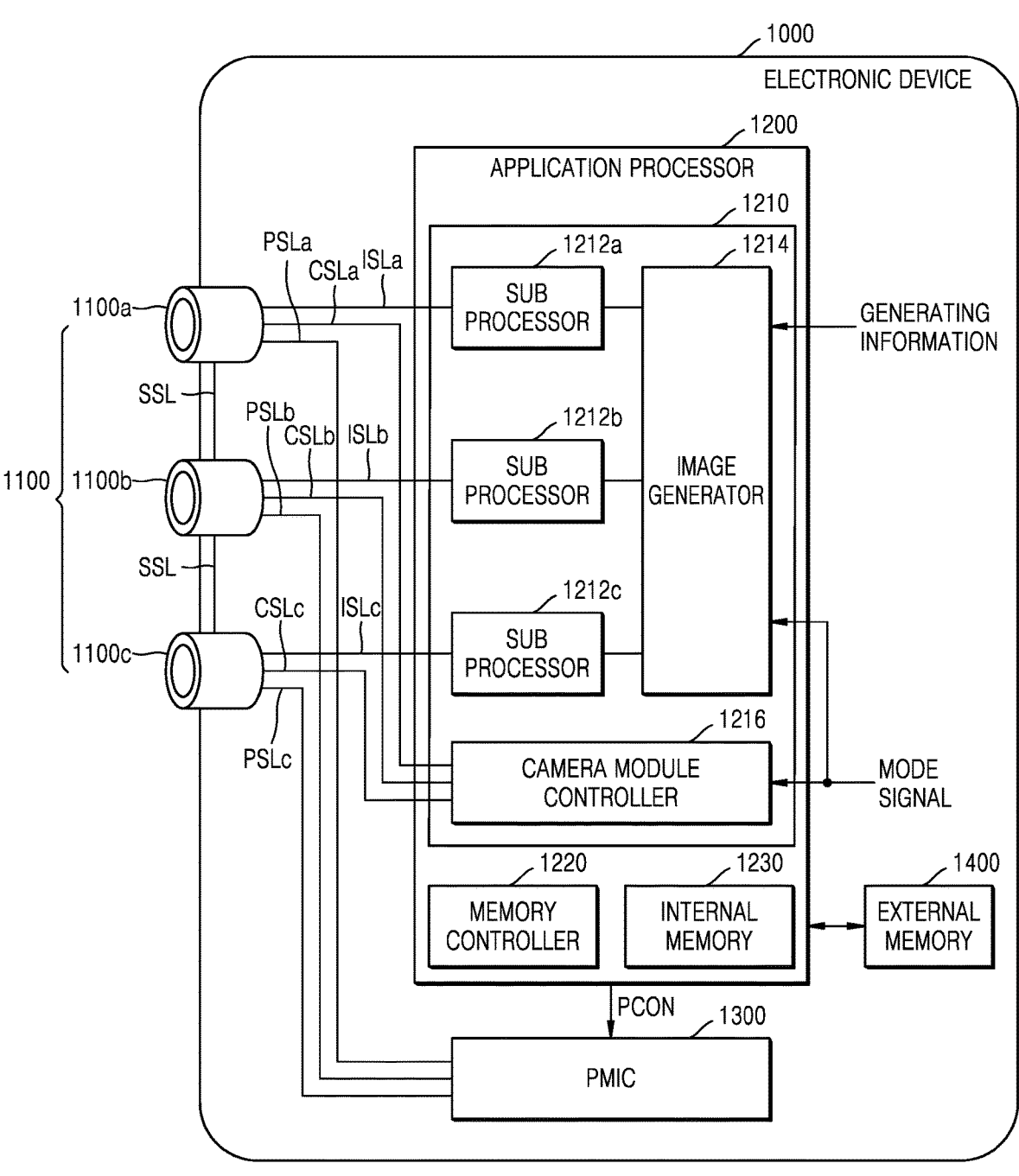
FIG. 10A is a block diagram of an electronic system according to embodiments.
Figure 10B:
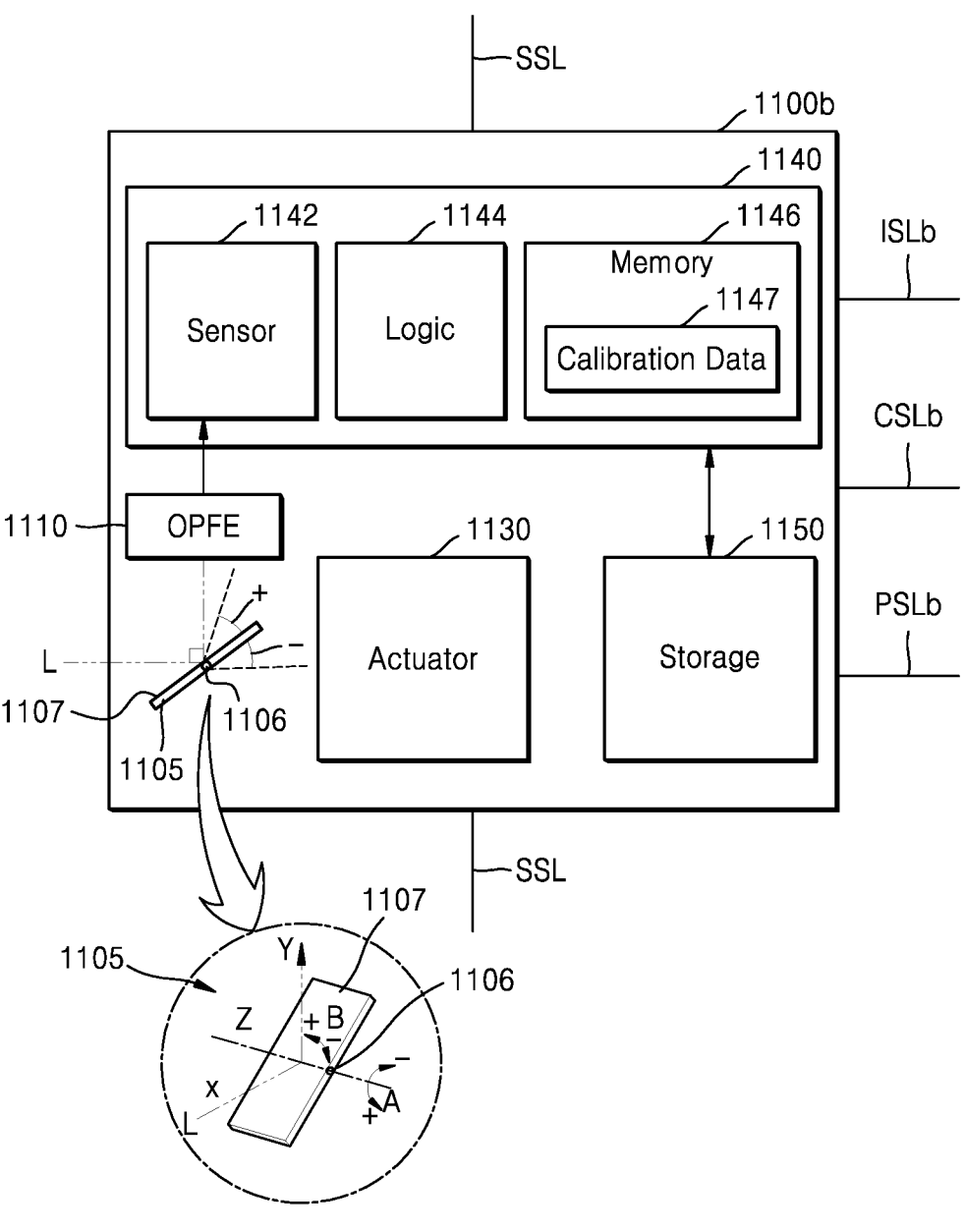
FIG. 10B is a detailed block diagram of a camera module included in the electronic system shown in FIG. 10A.

FIG. 10A is a block diagram of an electronic system 1000 according to an embodiment, and FIG. 10B is a detailed block diagram of a camera module included in the electronic system of FIG. 10A.

Referring to FIG. 10A, the electronic system 1000 may include a camera module group 1100, an application processor 1200, a power management integrated circuit (PMIC) 1300, and a external memory 1400.

The camera module group 1100 may include a plurality of camera modules 1100a, 1100b, and 1100c. Although three camera modules 1100a, 1100b, and 1100c are illustrated in FIG. 10A, the inventive concept is not limited thereto. In some embodiments, the camera module group 1100 may be modified to include only two camera modules. In some embodiments, the camera module group 1100 may be modified to include "n" camera modules, where "n" is a natural number of at least 4.

The detailed configuration of the camera module 1100b will be described with reference to FIG. 10B below. The descriptions below may be also applied to the other camera modules 1100a and 1100c.

Referring to FIG. 10B, the camera module 1100b may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some embodiments, the prism 1105 may change the path of the light L incident in a first direction (an X direction in FIG. 10B) into a second direction (a Y direction in FIG. 10B) perpendicular to the first direction. The prism 1105 may rotate the reflective surface 1107 of the light reflecting material in a direction A around a central shaft 1106 or rotate the central shaft 1106 in a direction B to change the path of the light L incident in the first direction (the X direction) into the second direction (the Y direction) perpendicular to the first direction (the X direction). In this case, the OPFE 1110 may move in a third direction (a Z direction in FIG. 10B), which is perpendicular to the first direction (the X direction) and the second direction (the Y direction).

In some embodiments, as illustrated in FIG. 10B, the maximum of a rotation angle of the prism 1105 may be less than or equal to about 15 degrees in a plus (+) A direction and greater than about 15 degrees in a minus (−) A direction. The plus A direction may correspond to a counter-clockwise rotation direction around the Z direction, and the minus A direction may correspond to a clockwise rotation direction around the Z direction. However, the inventive concept is not limited thereto.

In some embodiment, the prism 1105 may move by an angle of about 20 degrees or in a range from about 10 degrees to about 20 degrees or from about 15 degrees to about 20 degrees in a plus or minus B direction. In this case, an angle by which the prism 1105 moves in the plus B direction may be the same as or similar, within a difference of about 1 degree, to an angle by which the prism 1105 moves in the minus B direction. The plus B direction may correspond to a counter-clockwise direction around the X direction, and the minus B direction may correspond to a clockwise direction around the X direction.

In some embodiments, the prism 1105 may move the reflective surface 1107 of the light reflecting material in the third direction (the Z direction) parallel with an extension direction of the central shaft 1106.

The OPFE 1110 may include, for example, "m" optical lenses, where "m" is a natural number. The "m" lenses may move in the second direction (the Y direction) and change an optical zoom ratio of the camera module 1100b. For example, when the default optical zoom ratio of the camera module 1100b is Z, the optical zoom ratio of the camera module 1100b may be changed to 3Z (i.e., three times Z) or 5Z (i.e., five times Z) or greater by moving the "m" optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of an object using the light L provided through the optical lens. The control logic 1144 may control all operations of the camera module 1100b. For example, the control logic 1144 may control operation of the camera module 1100b according to a control signal provided through a control signal line CSLb.

The memory 1146 may store information, such as calibration data 1147, necessary for the operation of the camera module 1100b. The calibration data 1147 may include information, which is necessary for the camera module 1100b to generate image data using the light L provided from outside. For example, the calibration data 1147 may include information about a degree of rotation, information about a focal length, information about an optical axis, or the like. When the camera module 1100b is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, although the storage 1150 may include electrically erasable programmable read-only memory (EEPROM), the inventive concept is not limited thereto.

The image sensor 1142 may include the image sensor 100, 200, 300, 400, 500, and 600 described with reference to FIGS. 1 to 9, or an image sensor variously modified and changed therefrom within the scope of the inventive concept.

Referring to FIGS. 10A and 10B, in some embodiments, each of the camera modules 1100a, 1100b, and 1100c may include the actuator 1130. Accordingly, the camera modules 1100a, 1100b, and 1100c may include the calibration data 1147, which is the same as or different from each other according to the operation of the actuator 1130 included in each of the camera modules 1100a, 1100b, and 1100c.

In some embodiments, one (e.g., the camera module 1100b) of the camera modules 1100a, 1100b, and 1100c may be of a folded-lens type including the prism 1105 and the OPFE 1110, which are described above, while the other camera modules (e.g., the camera modules 1100a and 1100c) may be of a vertical type that does not include the prism 1105 and the OPFE 1110. However, the inventive concept is not limited thereto.

In some embodiments, one (e.g., the camera module 1100c) of the camera modules 1100a, 1100b, and 1100c may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100a or 1100b). In some embodiments, at least two camera modules (e.g., 1100a and 1100b) among the camera modules 1100a, 1100b, and 1100c may have different field-of-views. In this case, for example, the two camera modules (e.g., 1100a and 1100b) among the camera modules 1100a, 1100b, and 1100c may respectively have different optical lenses. However, the inventive concept is not limited thereto.

In some embodiments, the camera modules 1100a, 1100b, and 1100c may have different field-of-views from one another. In this case, although the camera modules 1100a, 1100b, and 1100c may respectively have different optical lenses, the inventive concept is not limited thereto.

In some embodiments, the camera modules 1100a, 1100b, and 1100c may be physically separated from one another. In other words, the sensing area of the image sensor 1142 is not divided and used by the camera modules 1100a, 1100b, and 1100c, but the image sensor 1142 may be independently included in each of the camera modules 1100a, 1100b, and 1100c.

Referring back to FIG. 10A, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips and separated from each other.

The image processing unit 1210 may include a plurality of sub-processors (e.g., 1212a, 1212b, and 1212c), an image generator 1214, and a camera module controller 1216. The image processing unit 1210 may include sub-processors (e.g., 1212a, 1212b, and 1212c) in number corresponding to the number of camera modules (e.g., 1100a, 1100b, 1100c). For example, each sub-processor may be associated with a corresponding camera module among the plurality of camera modules 1100a, 1100b, and 1100c.

Pieces of image data respectively generated by the camera modules 1100a, 1100b, and 1100c may be respectively provided to the corresponding ones of the sub-processors 1212a, 1212b, and 1212c through image signal lines ISLa, ISLb, and ISLc separated from each other. For example, image data generated by the camera module 1100a may be provided to the sub-processor 1212a through the image signal line ISLa, image data generated by the camera module 1100b may be provided to the sub-processor 1212b through the image signal line ISLb, and image data generated by the camera module 1100c may be provided to the sub-processor 1212c through the image signal line ISLc. Such image data transmission may be performed using, for example, a mobile industry processor interface (MIPI)-based camera serial interface (CSI). However, the inventive concept is not limited thereto.

In some embodiments, a single sub-processor may be arranged to correspond to a plurality of camera modules. For example, differently from FIG. 10A, the sub-processors 1212a and 1212c may not be separated but may be integrated into a single sub-processor, and the image data provided from the camera module 1100a or the camera module 1100c may be selected by a selection element (e.g., a multiplexer) and then provided to the integrated sub-processor.

The image data provided to each of the sub-processors 1212a, 1212b, and 1212c may be provided to the image generator 1214. The image generator 1214 may generate an output image by using the image data provided from each of the sub-processors 1212a, 1212b, and 1212c according to image generation information or a mode signal.

In detail, the image generator 1214 may generate the output image by merging at least portions of respective pieces of image data, which are respectively generated by the camera modules 1100a, 1100b, and 1100c having different field-of-views, according to the image generation information or the mode signal. Alternatively, the image generator 1214 may generate the output image by selecting one of pieces of image data, which are respectively generated by the camera modules 1100a, 1100b, and 1100c having different field-of-views, according to the image generation information or the mode signal.

In some embodiments, the image generation information may include a zoom signal or a zoom factor. In some embodiments, the mode signal may be based on a mode selected by a user.

When the image generation information includes a zoom signal or a zoom factor and the camera modules 1100a, 1100b, and 1100c have different field-of-views, the image generator 1214 may perform different operations according to different kinds of zoom signals. For example, when the zoom signal is a first signal, the image generator 1214 may merge image data output from the camera module 1100a and image data output from the camera module 1100c and then generate an output image by using a merged image signal and image data output from the camera module 1100b that is not used for merging. When the zoom signal is a second signal different from the first signal, the image generator 1214 may generate an output image by selecting one of the pieces of image data respectively output from the camera modules 1100a, 1100b, and 1100c, instead of performing the merging. However, the inventive concept is not limited thereto, and a method of processing image data may be changed whenever necessary.

In some embodiments, the image generator 1214 may receive a plurality of pieces of image data, which have different exposure times, from at least one of the sub-processors 1212a, 1212b, and 1212c and perform high dynamic range (HDR) processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separated from one another.

One (e.g., the camera module 1100b) of the camera modules 1100a, 1100b, and 1100c may be designated as a master camera according to the mode signal or the image generation signal including a zoom signal, and the other camera modules (e.g., the camera modules 1100a and 1100c) may be designated as slave cameras. Such designation information may be included in a control signal and provided to each of the camera modules 1100a, 1100b, and 1100c through a corresponding one of the control signal lines CSLa, CSLb, and CSLc, which are separated from one another.

A camera module operating as a master or a slave may be changed according to a zoom factor or an operation mode signal. For example, when the field-of-view of the camera module 1100a is greater than that of the camera module 1100b and the zoom factor indicates a low zoom ratio, the camera module 1100b may operate as a master and the camera module 1100a may operate as a slave. In contrast, when the zoom factor indicates a high zoom ratio, the camera module 1100a may operate as a master and the camera module 1100b may operate as a slave.

In some embodiments, a control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit the sync enable signal to the camera module 1100b. The camera module 1100b provided with the sync enable signal may generate a sync signal based on the sync enable signal and may provide the sync signal to the camera modules 1100a and 1100c through a sync signal line SSL. The camera modules 1100a, 1100b, and 1100c may be synchronized with the sync signal and may transmit image data to the application processor 1200.

In some embodiments, a control signal provided from the camera module controller 1216 to each of the camera modules 1100a, 1100b, and 1100c may include mode information according to the mode signal. The camera modules 1100a, 1100b, and 1100c may operate in a first operation mode or a second operation mode in relation with a sensing speed based on the mode information.

In the first operation mode, the camera modules 1100a, 1100b, and 1100c may generate an image signal at a first speed (e.g., at a first frame rate), encode the image signal at a second speed higher than the first speed (e.g., at a second frame rate higher than the first frame rate), and transmit an encoded image signal to the application processor 1200. In this case, the second speed may be 30 times or less the first speed.

The application processor 1200 may store the received image signal, i.e., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub-processors 1212a, 1212b, and 1212c of the image processing unit 1210 may perform the decoding and may also perform image processing on the decoded image signal.

In the second operation mode, the camera modules 1100a, 1100b, and 1100c may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of the camera modules 1100a, 1100b, and 1100c. For example, under control by the application processor 1200, the PMIC 1300 may provide first power to the camera module 1100a through a power signal line PSLa, second power to the camera module 1100b through a power signal line PSLb, and third power to the camera module 1100c through a power signal line PSLc.

The PMIC 1300 may generate power corresponding to each of the camera modules 1100a, 1100b, and 1100c and adjust the level of the power, in response to a power control signal PCON from the application processor 1200. The power control signal PCON may include a power adjustment signal for each operation mode of the camera modules 1100a, 1100b, and 1100c. For example, the operation mode may include a low-power mode. In this case, the power control signal PCON may include information about a camera module configured to operate in the low-power mode and a power level to be set. The same or different levels of power may be respectively provided to the camera modules 1100a, 1100b, and 1100c. The level of power may be dynamically changed.

Next, a method of manufacturing an image sensor, according to embodiments, will be described.

FIGS. 11A to 18B are cross-sectional views of a process sequence of a method of manufacturing an image sensor, according to embodiments. Specifically, FIGS. 11A, 12A, 13A, 14A, 15A, 16A, 17A, and 18A are each a cross-sectional view of a portion corresponding to a cross-section taken along line I-I' of FIG. 3A, according to a process sequence. FIGS. 11B, 12B, 13B, 14B, 15B, 16B, 17B, and 18B are each a cross-sectional view of a portion corresponding to a cross-section taken along line II-II' of FIG. 3A, according to a process sequence. An example method of manufacturing the image sensor 100 shown in FIGS. 3A to 3D will be described with reference to FIGS. 11A to 18B.

Figure 11A:
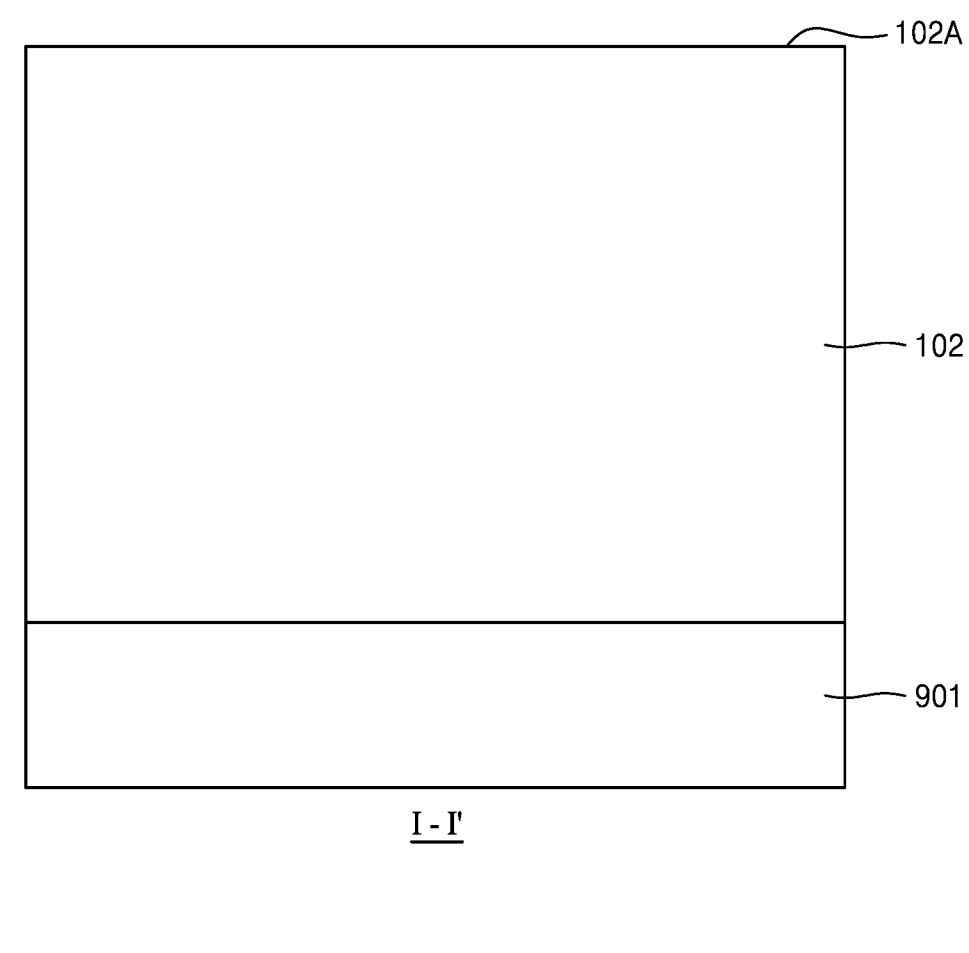
Figure 11B:
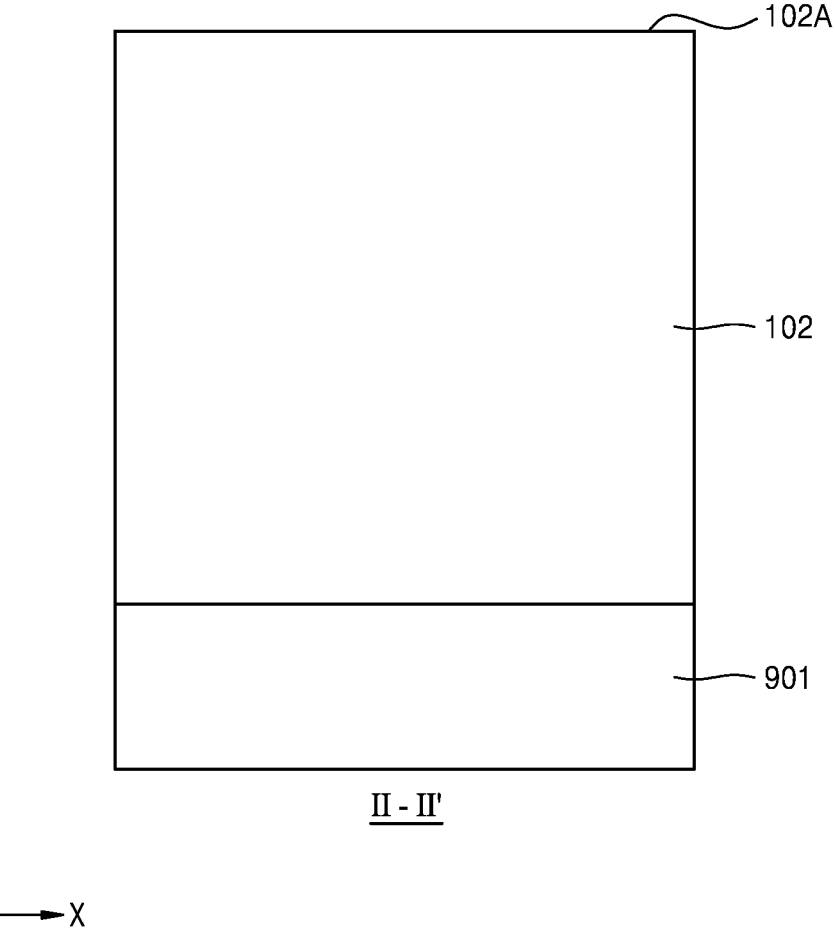

Referring to FIGS. 11A and 11B, a substrate 102 including an epitaxial semiconductor layer may be formed on a silicon substrate 901.

In embodiments, the silicon substrate 901 may include single crystalline silicon. The substrate 102 may include a single crystalline silicon film epitaxially grown from a surface of the silicon substrate 901. In embodiments, the silicon substrate 901 and the substrate 102 may include a single crystalline silicon film doped with boron (B) ions. After the substrate 102 is formed, a front side surface 102A of the substrate 102 may be exposed.

Figure 12A:
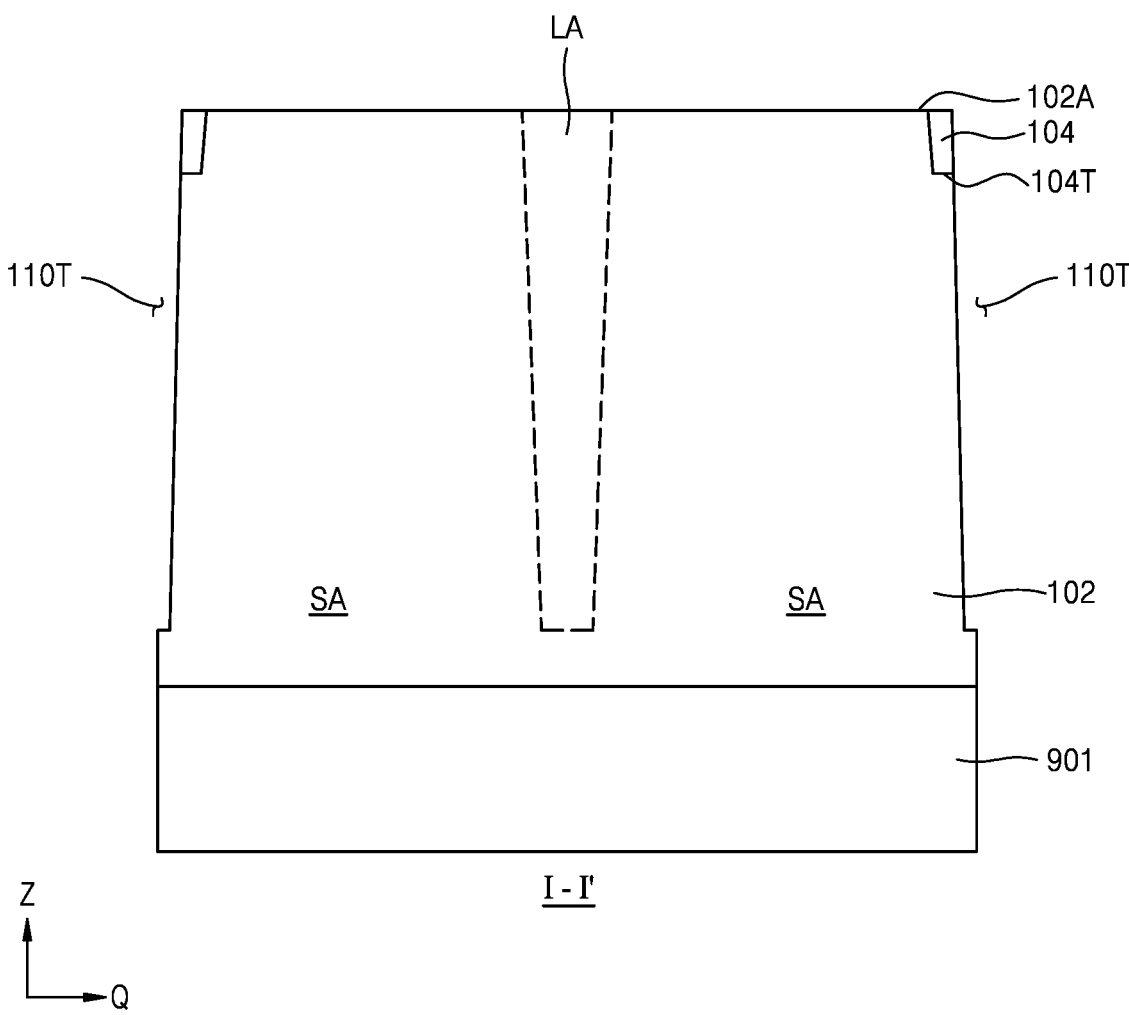
Figure 12B:
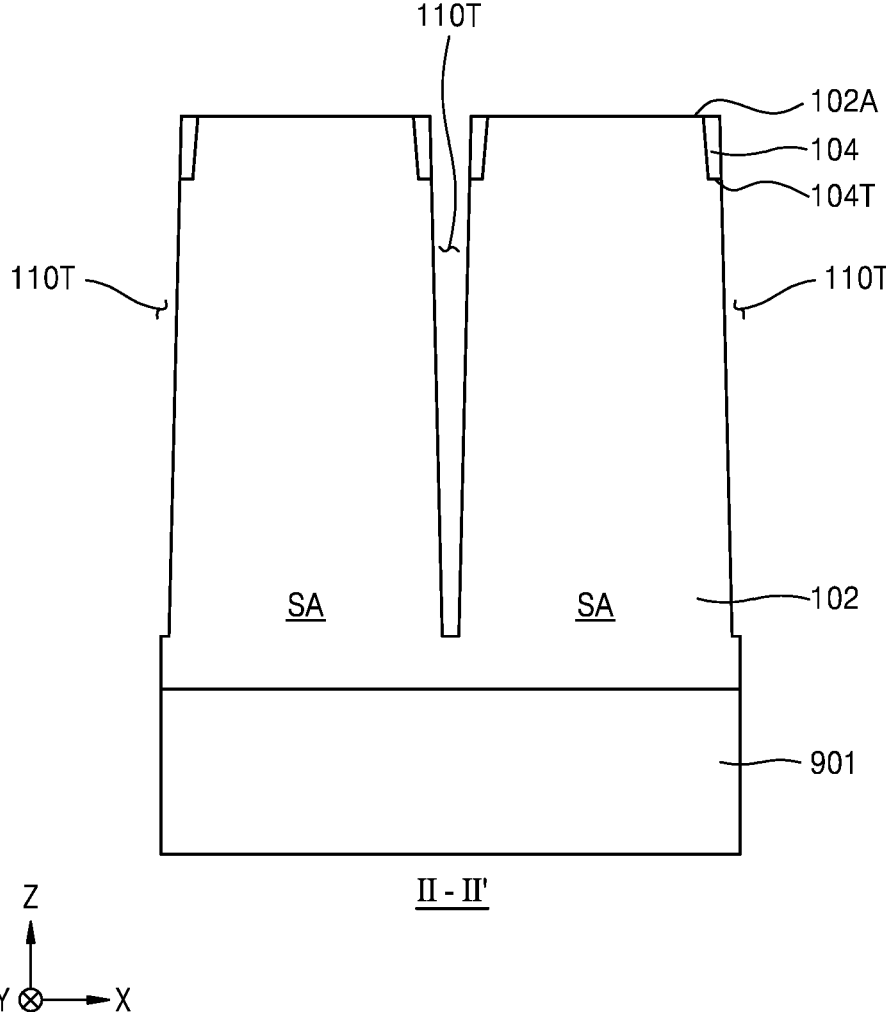

Referring to FIGS. 12A and 12B, in the resultant structure of FIGS. 11A and 11B, a plurality of shallow trenches 104T may be formed by partially etching the substrate 102 from the front side surface 102A of the substrate 102. After that, a local isolation film 104 may be formed to fill the plurality of shallow trenches 104T. Thereafter, a plurality of deep trenches 110T may be formed to pass through the local isolation film 104 and a portion of the substrate 102. Portions of a plurality of sensing areas SA may be defined by the plurality of deep trenches 110T.

After the plurality of deep trenches 110T are formed, the substrate 102 may include a local area LA having a relatively small width, which is defined by the plurality of deep trenches 110T.

After the plurality of deep trenches 110T are formed, at least two adjacent ones of the plurality of sensing areas SA may be connected to each other by the local area LA of the substrate 102, in which the plurality of deep trenches 110T are not formed. The local area LA of the substrate 102, in which the plurality of deep trenches 110T are not formed, may serve as a support structure configured to prevent failures, such as undesired leaning of the plurality of sensing areas SA defined by the plurality of deep trenches 110T and collapse thereof.

Figure 13A:
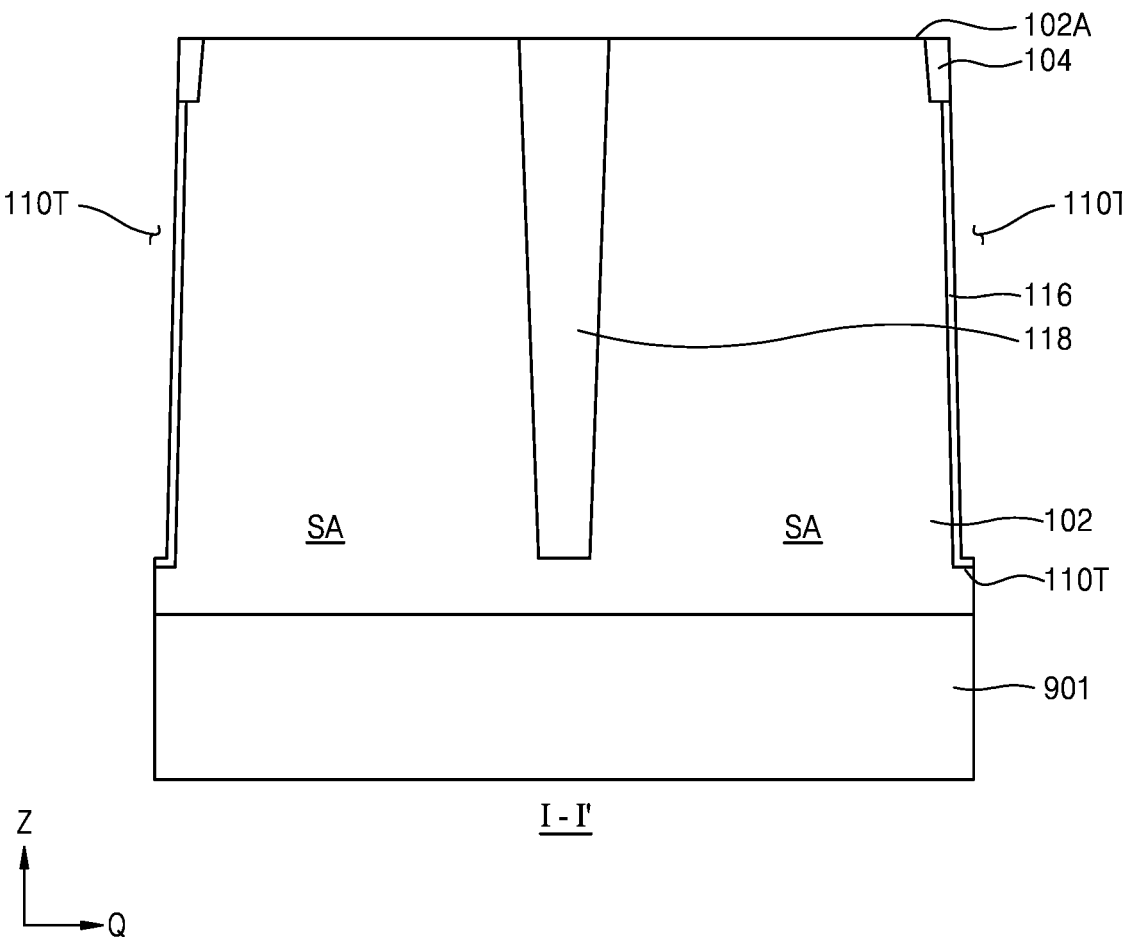
Figure 13B:
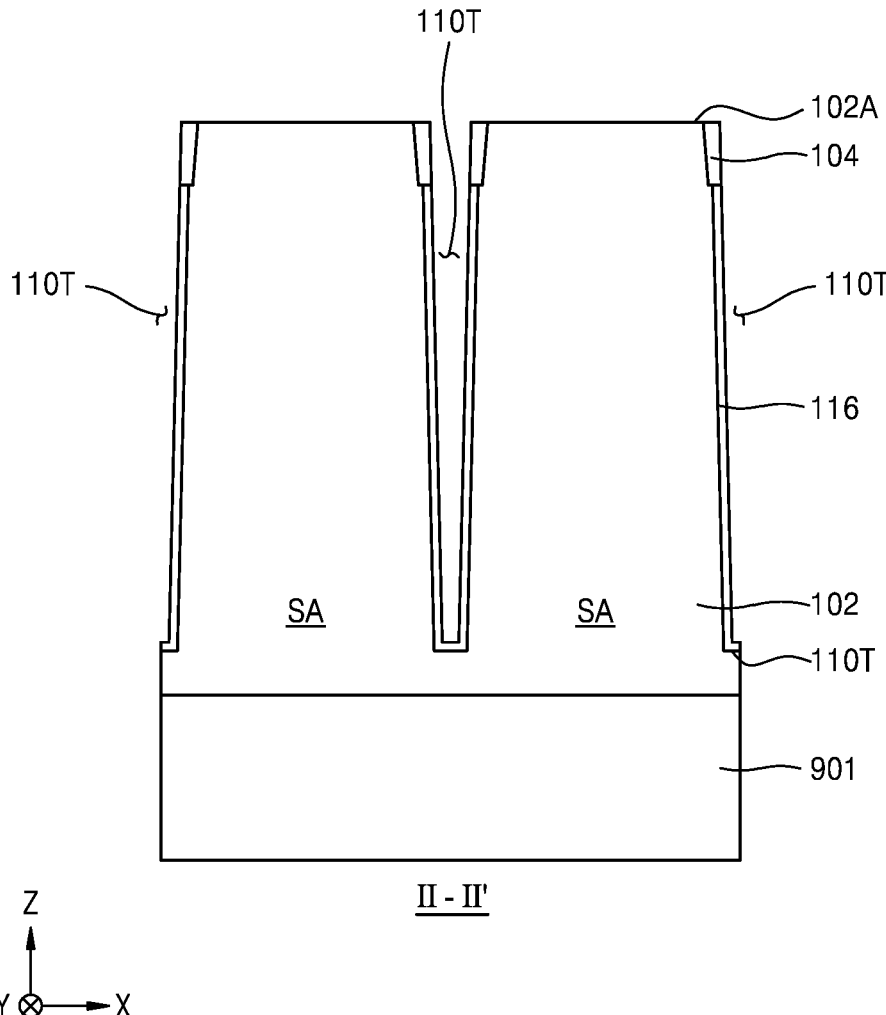

Referring to FIGS. 13A and 13B, in the resultant structure of FIGS. 12A and 12B, an ion implantation process may be performed through the deep trench 110T and then an annealing process may be performed. Thus, a doped isolation liner 116 may be formed in a partial region of the substrate 102 exposed at the deep trench 110T, and a doped isolation pillar 118 may be formed in the local area LA having a relatively small width, which is defined by the deep trench 110T in the substrate 102. The doped isolation liner 116 and the doped isolation pillar 118 may be formed at the same time. The doped isolation pillar 118 may be a resultant structure obtained by diffusing dopants ion-implanted through the deep trench 110T into the local area LA of the substrate 102 by using the annealing process.

Figure 14A:
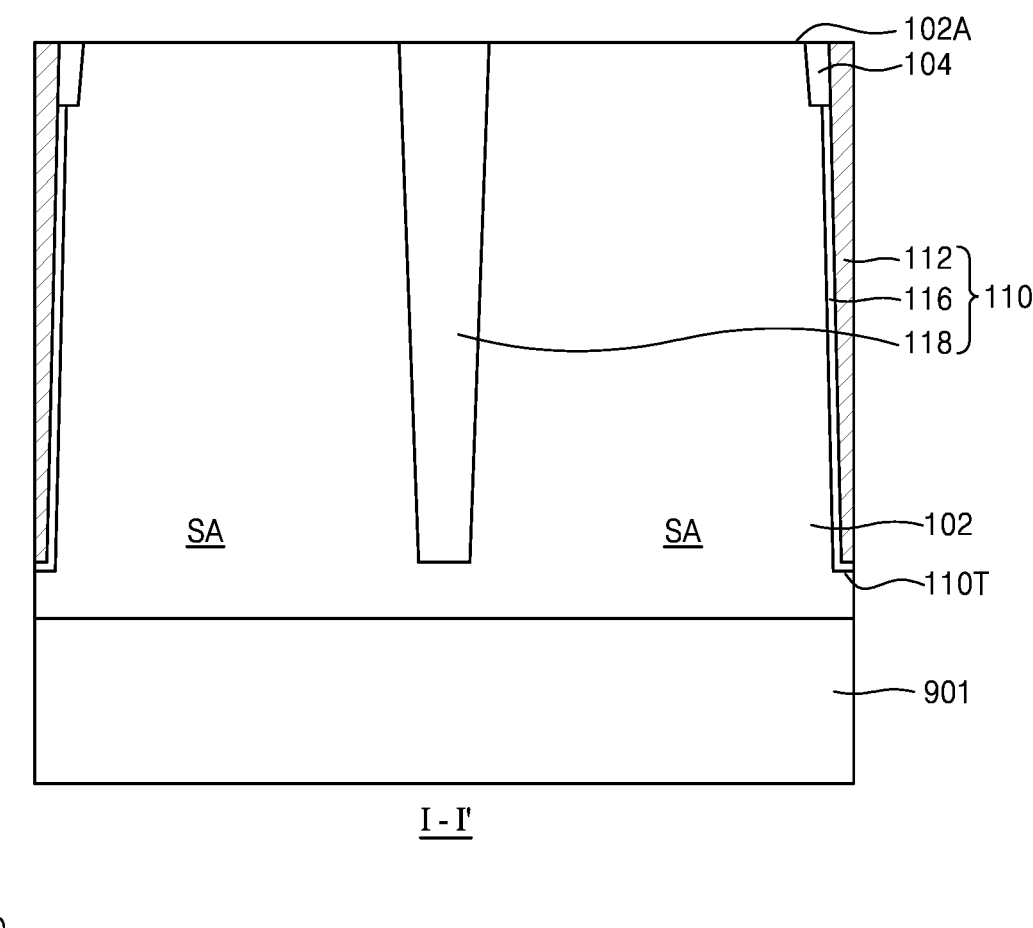
Figure 14B:
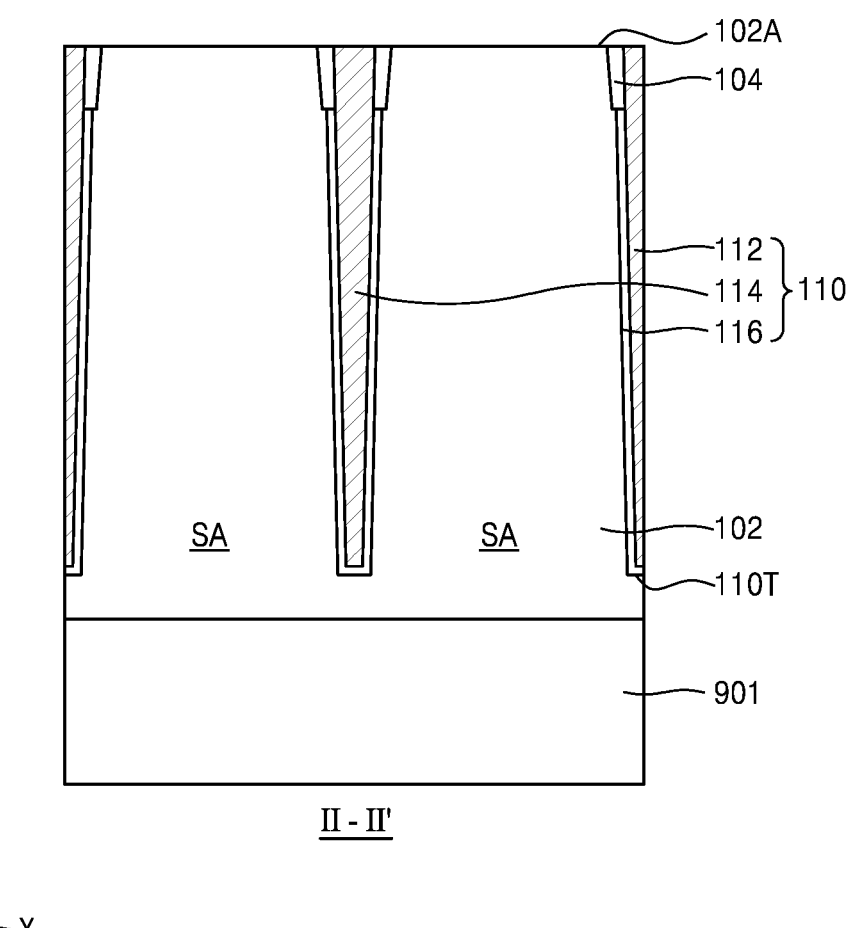

Referring to FIGS. 14A and 14B, in the resultant structure of FIGS. 13A and 13B, an outer isolation film 112 and a plurality of inner isolation films 114 may be formed to fill the deep trench 110T. The outer isolation film 112, the plurality of inner isolation films 114, the doped isolation liner 116, and the doped isolation pillar 118 may constitute a pixel isolation structure 110. A plurality of sensing areas SA may be defined by the pixel isolation structure 110.

Figure 15A:
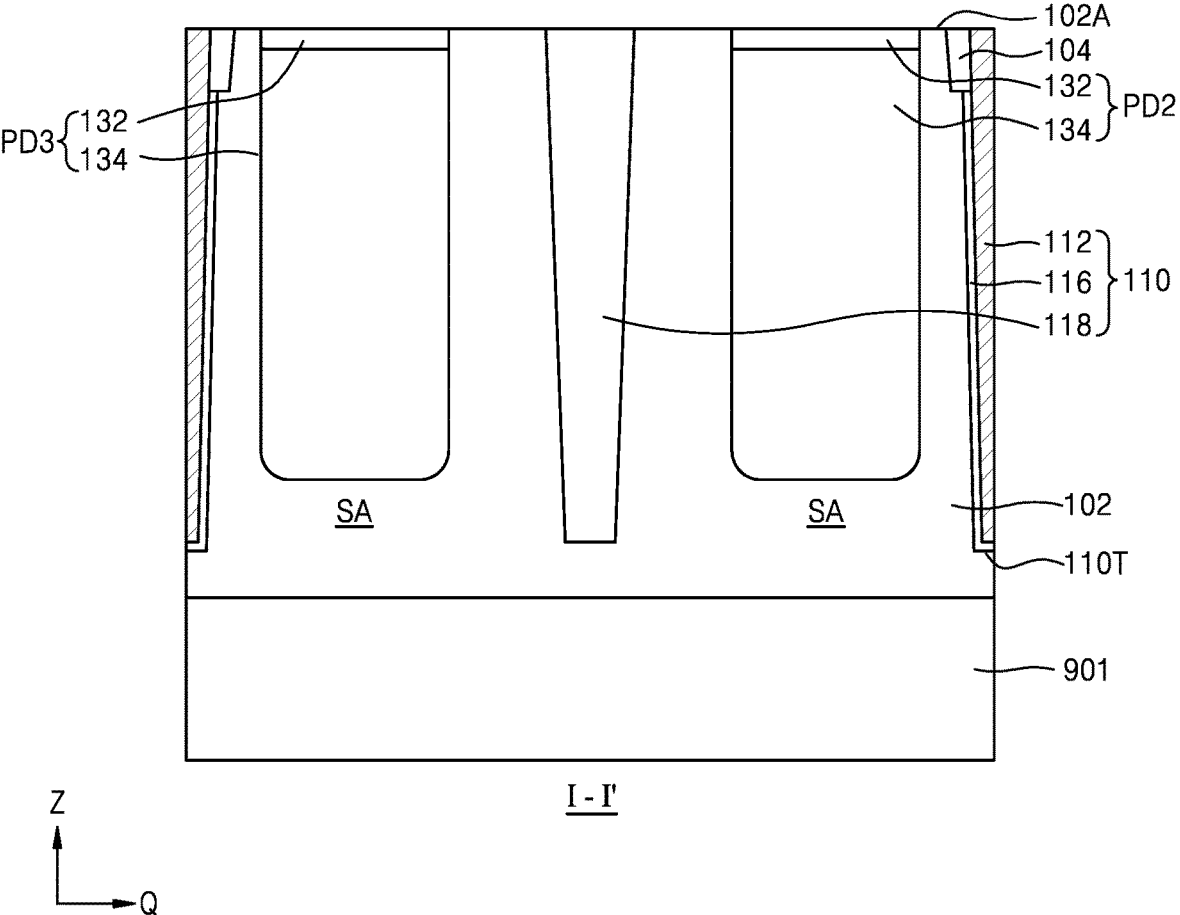
Figure 15B:
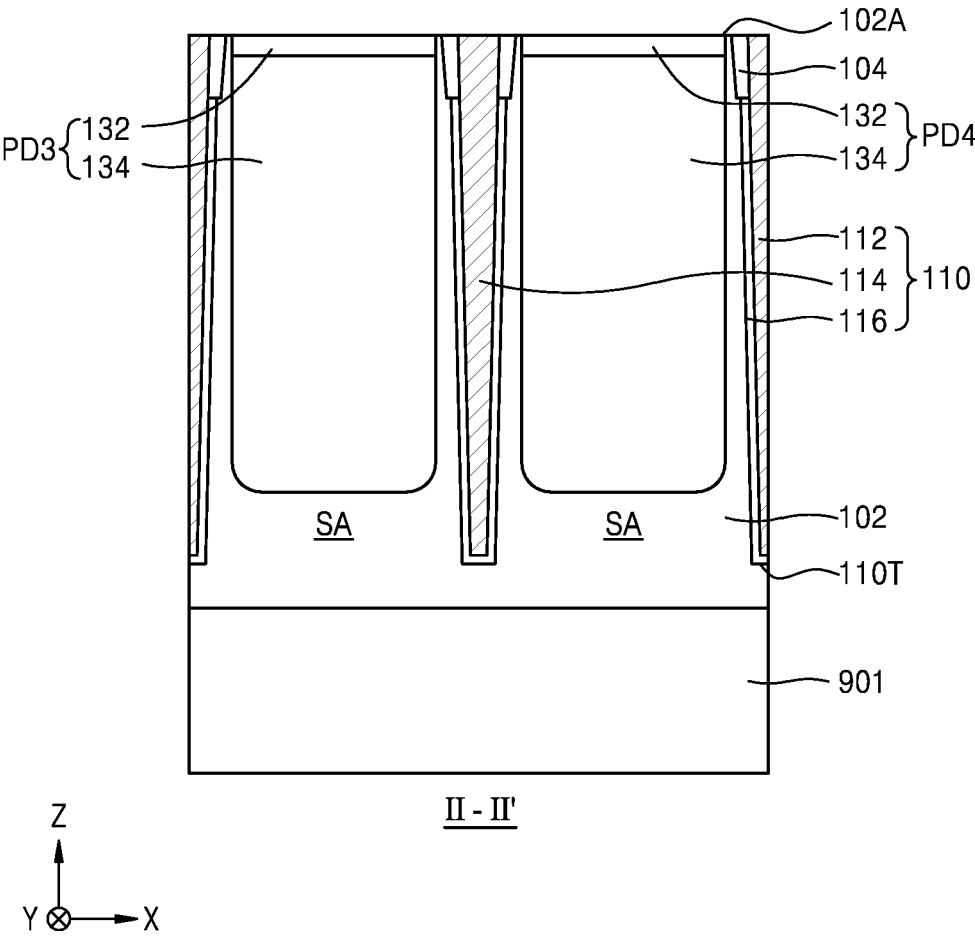

Referring to FIGS. 15A and 15B, in the resultant structure of FIGS. 14A and 14B, by performing an ion implantation process, first to fourth photodiodes (refer to PD1, PD2, PD3, and PD4 in FIG. 3A) may be formed in the sensing area SA from the front side surface 102A of the substrate 102. In embodiments, to form the first to fourth photodiodes PD1, PD2, PD3, and PD4, ion implantation processes for forming a plurality of first semiconductor regions 132 and a plurality of second semiconductor regions 134 may be performed.

Figure 16A:
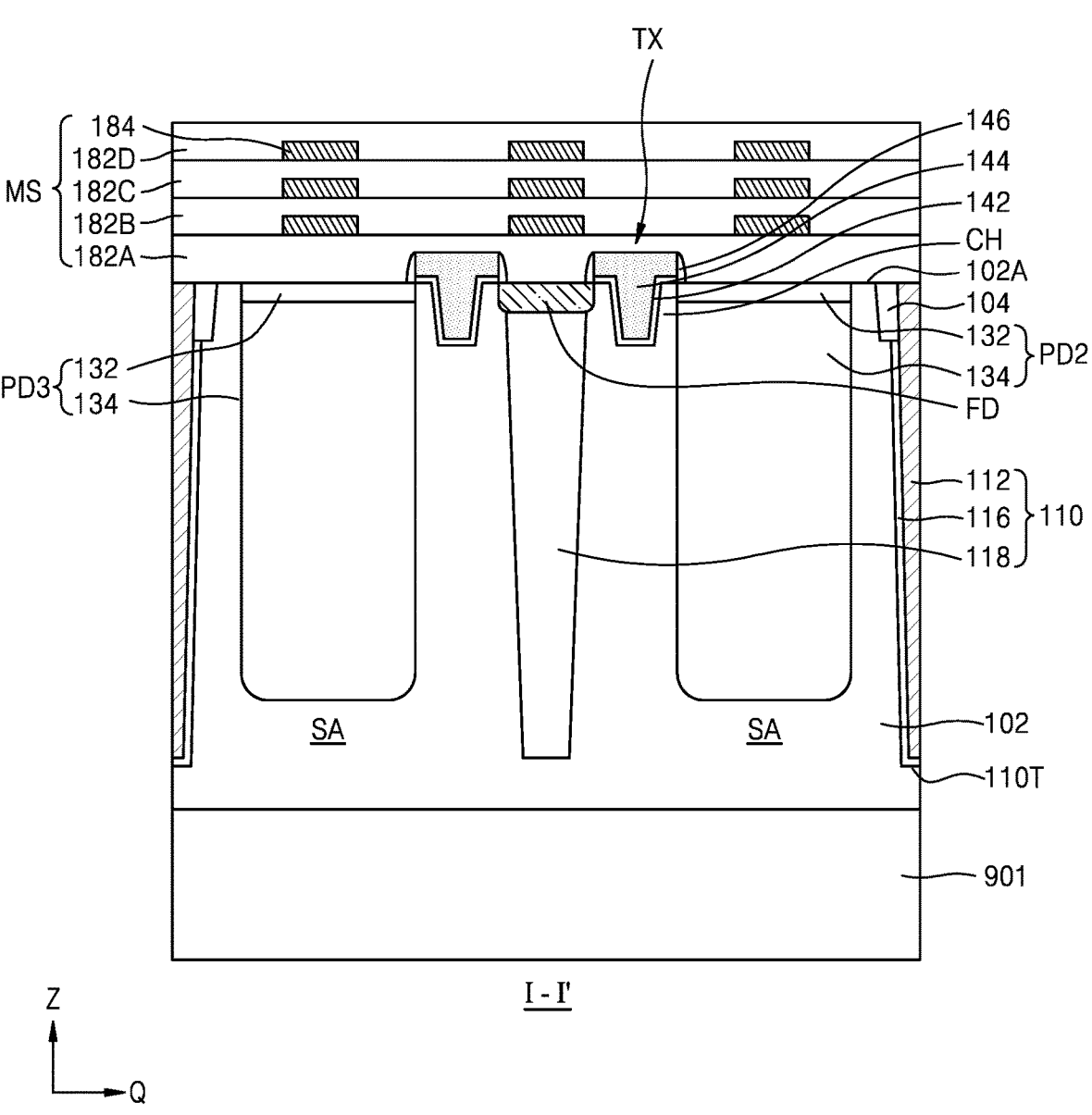
Figure 16B:
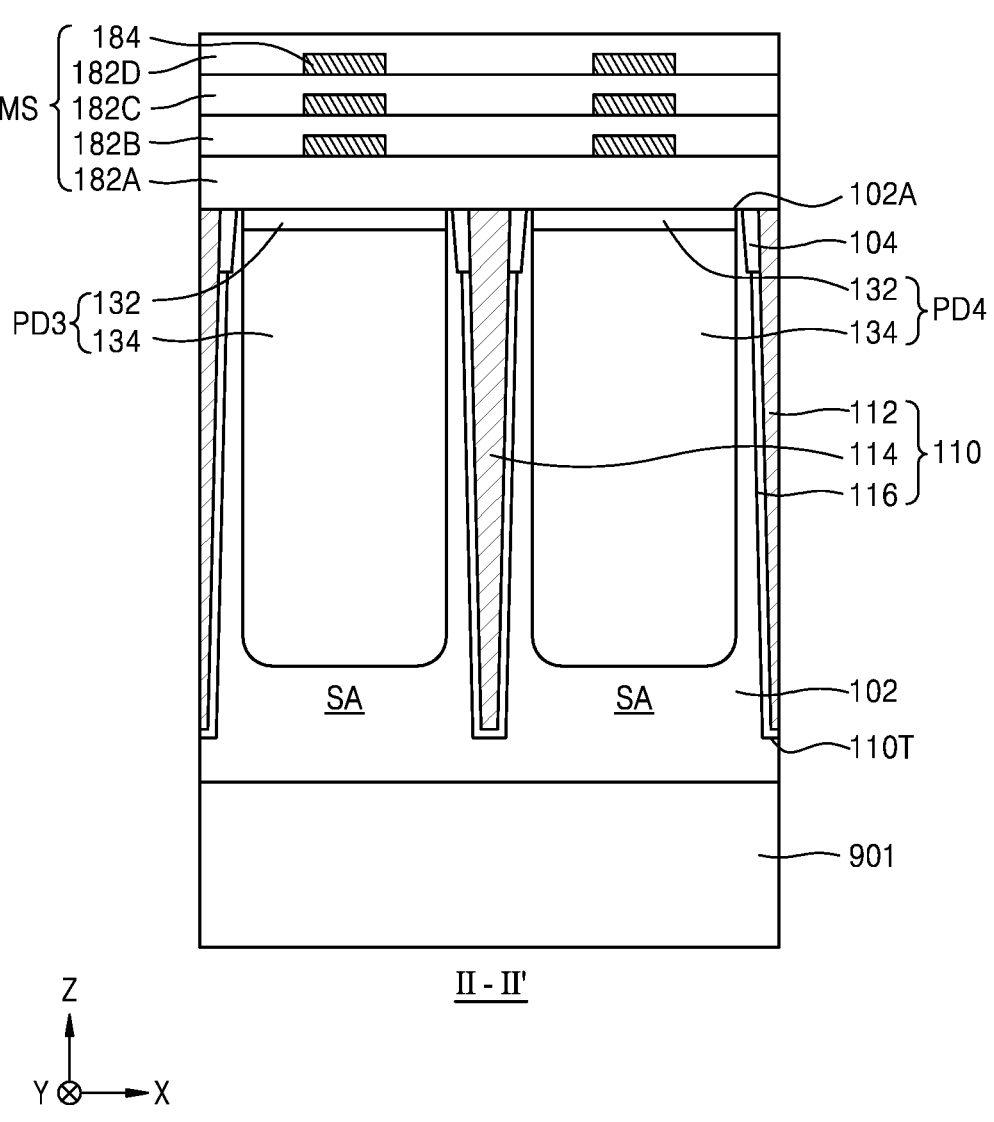

Referring to FIGS. 16A and 16B, in the resultant structure of FIGS. 15A and 15B, a plurality of gate structures, each of which includes a gate dielectric film 142 and a transfer gate 144, may be formed on the front side surface 102A of the substrate 102. Impurity ions may be implanted into a partial region of the substrate 102 from the front side surface 102A of the substrate 102 to form a floating diffusion region FD. The plurality of gate structures may include gate structures, which form transistors required to drive a plurality of sub-pixels SP1 included in the image sensor 100 described with reference to FIGS. 2 and 3A to 3D. Afterwards, a wiring structure MS may be formed on the plurality of gate structures. The wiring structure MS may include interlayer insulating films 182A, 182B, 182C, and 182D, which form a multilayered structure, and a plurality of wiring layers 184, which form a multilayered structure.

Although only the partial region of the color unit pixel CP1 of the substrate 102 is illustrated in the present embodiment, the substrate 102 may further include the plurality of pixel groups PG described with reference to FIG. 1, and a peripheral circuit area (not shown) and a pad area (not shown), which are around the plurality of pixel groups PG. The peripheral circuit area may be an area including various types of circuits configured to control the plurality of pixel groups PG. For example, the peripheral circuit area may include a plurality of transistors. The plurality of transistors may be driven to provide a constant signal to each of the first to fourth photodiodes PD1, PD2, PD3, and PD4 or control an output signal from each of the first to fourth photodiodes PD1, PD2, PD3, and PD4. For example, the plurality of transistors may constitute various types of logic circuits such as a timing generator, a row decoder, a row driver, a CDS, an ADC, a latch, and a column decoder. The pad area may include conductive pads electrically connected to the plurality of pixel groups PG and the circuits in the peripheral circuit area. The conductive pads may function as connection terminals configured to supply power and signals to the plurality of pixel groups PG and the circuits in the peripheral circuit area from the outside.

Figure 17A:
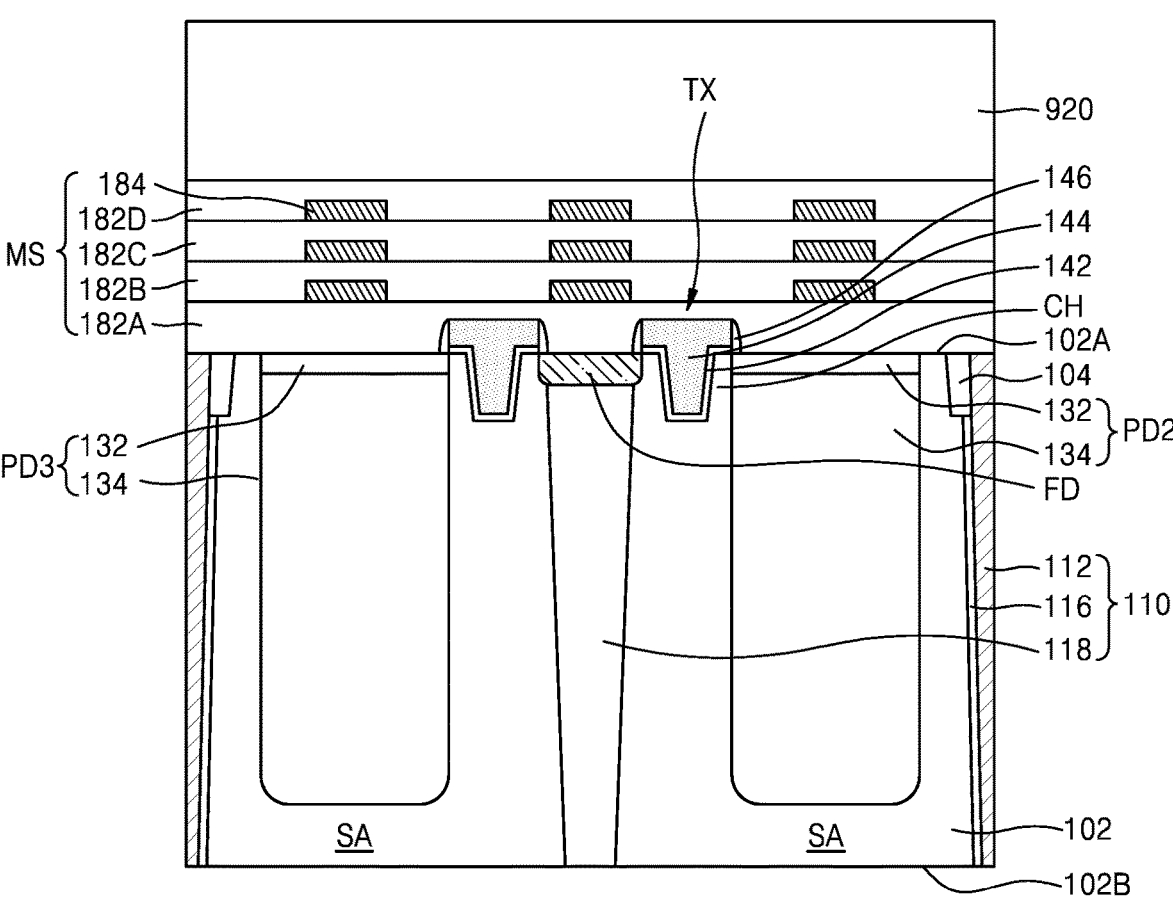
Figure 17A:
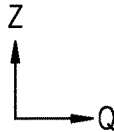
Figure 17B:
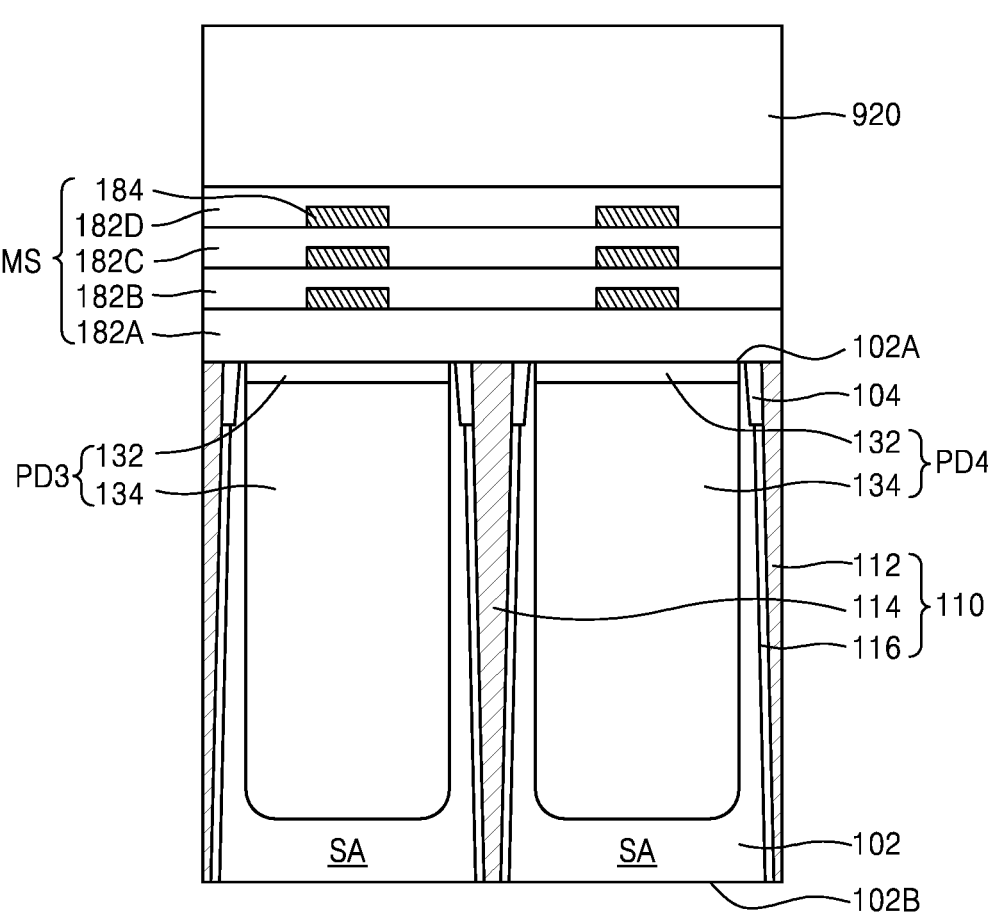
Figure 17B:
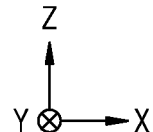
Figure 18A:
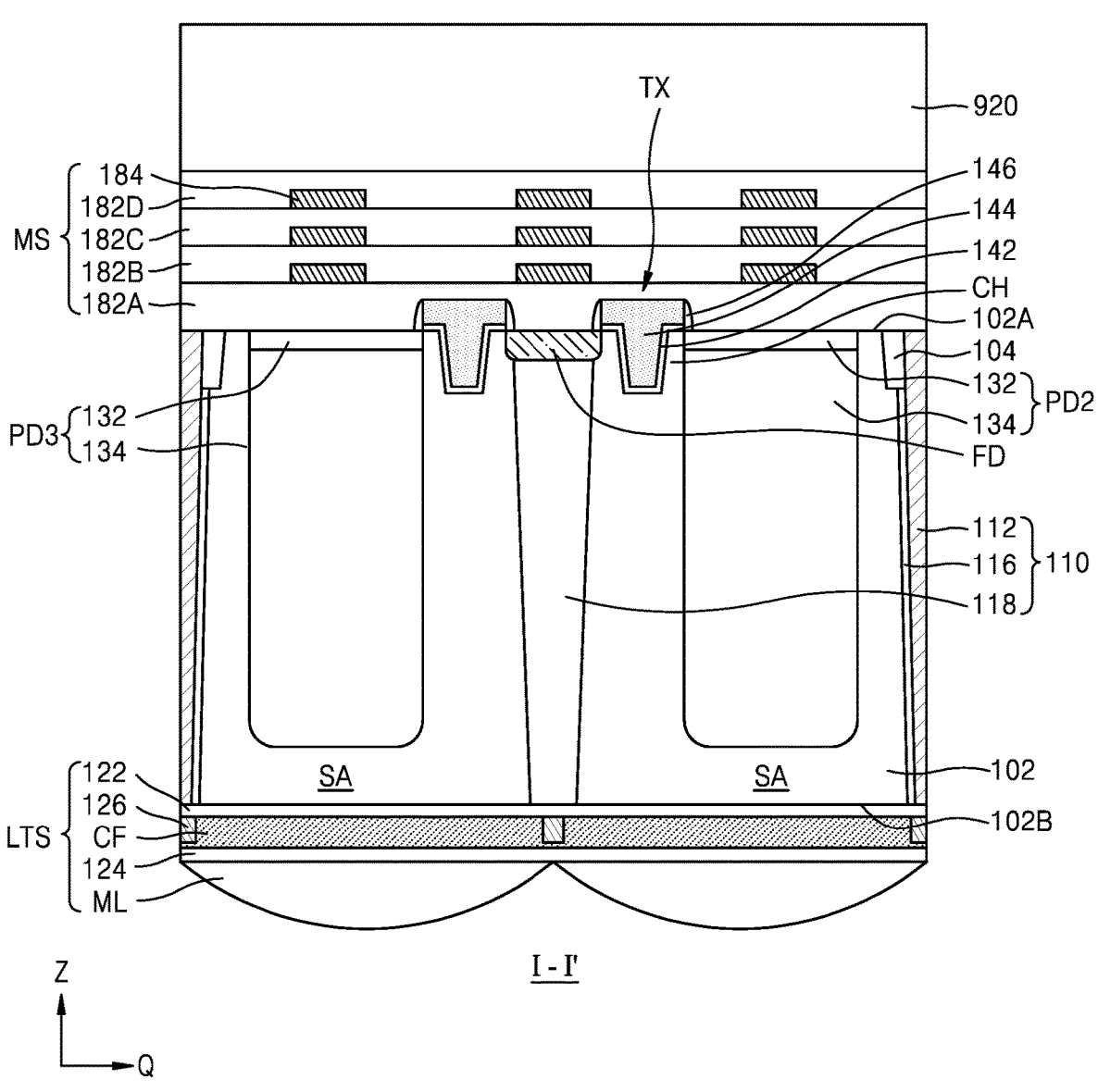
Figure 18B:
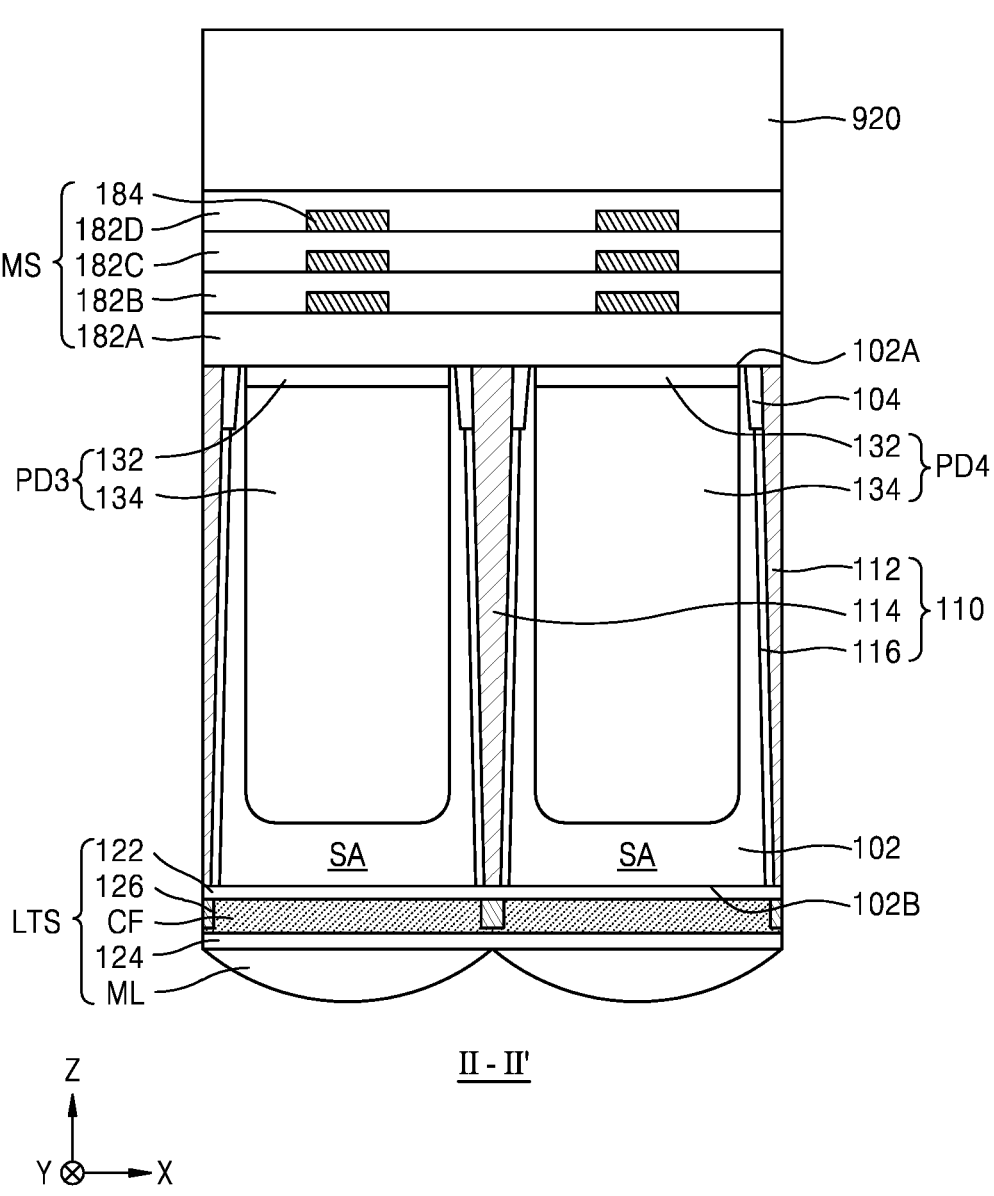

Referring to FIGS. 17A and 17B, a support substrate 920 may be adhered onto a wiring structure MS in the resultant structure of FIGS. 16A and 16B. An adhesive layer (not shown) may be between the support substrate 920 and an interlayer insulating film 182D. Thereafter, while the support substrate 920 is being adhered to the wiring structure MS, the silicon substrate (refer to 901 in FIGS. 16A and 16B), a portion of the substrate 102, and a portion of the doped isolation liner 116 may be removed by using a mechanical grinding process, a chemical mechanical polishing (CMP) process, a wet etching process, or a combination thereof. Thus, a back side surface 102B of the substrate 102, a bottom surface of the outer isolation film 112, bottom surfaces of the plurality of inner isolation films 114, a bottom surface of the doped isolation liner 116, and a bottom surface of the doped isolation pillar 118 may be exposed. Referring to FIGS. 18A and 18B, in the resultant structure of FIGS. 17A and 17B, a first planarization film 122, an anti-reflecting film 126, a color filter CF, a second planarization film 124, and a microlens ML may be sequentially formed on the back side surface 102B of the substrate 102, the bottom surface of the outer isolation film 112, the bottom surfaces of the plurality of inner isolation films 114, the bottom surface of the doped isolation liner 116, and the bottom surface of the doped isolation pillar 118, and thus, a light-transmitting structure LTS may be formed. Afterwards, the support substrate 920 may be removed, and thus, the image sensor 100 shown in FIGS. 3A to 3D may be manufactured.

In the method of manufacturing the image sensor 100, which has been described with reference to FIGS. 11A to 18B according to the embodiments, even when an aspect ratio of each of the plurality of sensing areas SA is relatively high, when processes required to form the pixel isolation structure 110 are performed during the manufacture of the image sensor 100, the occurrence of process failures, such as undesired leaning of patterns and collapse of patterns for forming the plurality of sensing areas SA, may be prevented. In particular, after the plurality of deep trenches 110T are formed in the process described with reference to FIGS. 12A and 12B, the substrate 102 may include a local area LA having a relatively small width, which is defined by the plurality of deep trenches 110T. After the plurality of deep trenches 110T are formed, at least two adjacent ones of the plurality of sensing areas SA may be supported by the local area LA of the substrate 102. Accordingly, in the resultant structure including the plurality of deep trenches 110T, the local area LA of the substrate 102 may prevent the plurality of sensing areas SA from undesirably leaning or collapsing, thereby maintaining stable structures. Therefore, the occurrence of process failures may be prevented during the manufacture of the image sensor 100, and the sensitivity and resolution of the image sensor 100 may be improved.

Although the method of manufacturing the image sensor 100 shown in FIGS. 3A to 3D has been described with reference to FIGS. 11A to 18B, it will be understood that the image sensors 200, 300, 400, 500, and 600 described with reference to FIGS. 4 to 9B and image sensors having various structures may be manufactured by making various modifications and changes within the scope of the inventive concept.

While the inventive concept has been particularly shown and described with reference to embodiments thereof, it will be understood that various changes in form and details may be made therein without departing from the spirit and scope of the following claims

What is claimed is:

1. An image sensor comprising:
a color unit pixel comprising a plurality of sub-pixels arranged in an m×n matrix on a substrate, wherein each of m and n is a natural number of 2 to 10; and
a pixel isolation structure configured to isolate the plurality of sub-pixels from each other in the color unit pixel,
wherein the pixel isolation structure comprises:
an outer isolation film, when viewed in a plan view, surrounding the color unit pixel;

27 at least one inner isolation film comprising a portion between two sub-pixels, which are adjacent to each other, among the plurality of sub-pixels;

a doped isolation liner covering opposite sidewalls of the at least one inner isolation film; and at least one doped isolation pillar contacting at least two sub-pixels selected from the plurality of sub-pixels, and wherein the at least one doped isolation pillar and the at least one inner isolation film, when viewed in the plan view, are connected to each other to define a size of each of the plurality of sub-pixels.

2. The image sensor of claim 1,
wherein the doped isolation liner is integrally connected to the at least one doped isolation pillar.

3. The image sensor of claim 1, further comprising:
a floating diffusion region disposed at a first surface of the substrate and overlapping a corresponding doped isolation pillar of the at least one doped isolation pillar in a vertical direction,
wherein the corresponding doped isolation pillar extends from a second surface of the substrate to the floating diffusion region.

4. The image sensor of claim 1,
wherein a height of each of an uppermost surface of the doped isolation liner and an uppermost surface of the at least one doped isolation pillar is less than a height of an uppermost surface of each of the outer isolation film and the at least one inner isolation film, and
wherein a height of the uppermost surface of the doped isolation liner is different from a height of the uppermost surface of the at least one doped isolation pillar.

5. The image sensor of claim 1,
wherein the at least one inner isolation film is integrally connected to the outer isolation film.

6. The image sensor of claim 1,
wherein the substrate comprises a front side surface and a back side surface, which are opposite to each other,
wherein the outer isolation film and the at least one inner isolation film pass through the substrate from the front side surface of the substrate to the back side surface thereof in a vertical direction, and
wherein each of the doped isolation liner and the at least one doped isolation pillar has a smaller length than each of the outer isolation film and the at least one inner isolation film in the vertical direction.

7. The image sensor of claim 1, further comprising:
a plurality of photodiodes disposed in the plurality of sub-pixels, respectively;
a plurality of color filters covering the plurality of sub-pixels, respectively, wherein the plurality of color filters are disposed on a back side surface of the substrate; and
a plurality of microlenses overlapping the plurality of sub-pixels, respectively,
wherein the plurality of color filters are disposed between the plurality of sub-pixels and the plurality of microlenses, respectively.

8. The image sensor of claim 1, further comprising
a plurality of color filters overlapping the plurality of sub-pixels, respectively,
wherein the plurality of color filters are disposed on a back side surface of the substrate, and
wherein the plurality of color filters are color filters of the same color.

9. The image sensor of claim 1,
wherein the color unit pixel comprises four sub-pixels arranged in a 2×2 matrix,
wherein the at least one doped isolation pillar comprises a first doped isolation pillar contacting a sensing area of each of the four sub-pixels, and
wherein the at least one inner isolation film comprises four inner isolation films contacting the first doped isolation pillar.

10. The image sensor of claim 1,
wherein the color unit pixel comprises four sub-pixels arranged in a 2×2 matrix,
wherein the at least one doped isolation pillar comprises four doped isolation pillars spaced apart from each other,
wherein each of the four doped isolation pillars contacts a sensing area of each of at least two sub-pixels selected from the four sub-pixels,
wherein the at least one inner isolation film comprises a cross-shaped inner isolation film facing a sensing area of each of the four sub-pixels, and
wherein the cross-shaped inner isolation film contacts the four doped isolation pillars.

11. The image sensor of claim 1,
wherein the color unit pixel comprises nine sub-pixels arranged in a 3×3 matrix,
wherein the at least one doped isolation pillar comprises at least four doped isolation pillars spaced apart from each other, and
wherein each of the at least four doped isolation pillars contacts a sensing area of each of at least two sub-pixels selected from the nine sub-pixels.

12. The image sensor of claim 1,
wherein the color unit pixel comprises nine sub-pixels arranged in a 3×3 matrix,
wherein the at least one doped isolation pillar comprises four doped isolation pillars spaced apart from each other,
wherein each of the four doped isolation pillars contacts a sensing area of each of four sub-pixels selected from the nine sub-pixels,
wherein the at least one inner isolation film comprises a plurality of first inner isolation films and a plurality of second outer isolation films,
wherein the plurality of first inner isolation films are integrally connected to the outer isolation film, and
wherein the plurality of second outer isolation films are spaced apart from the outer isolation film in a lateral direction.

13. The image sensor of claim 1,
wherein the color unit pixel comprises nine sub-pixels arranged in a 3×3 matrix,
wherein the at least one doped isolation pillar comprises at least six doped isolation pillars apart from each other,
wherein each of the at least six doped isolation pillars contacts a sensing area of each of two sub-pixels selected from the nine sub-pixels, and
wherein the at least one inner isolation film is integrally connected to the outer isolation film.

14. An image sensor comprising:
a pixel group on a substrate, the pixel group comprising a plurality of color unit pixels arranged in a 2×2 matrix; and
a pixel isolation structure configured to isolate a plurality of sub-pixels from each other in each of the plurality of color unit pixels,
wherein in one color unit pixel selected from the plurality of color unit pixels, the plurality of sub-pixels are arranged in an m×n matrix and comprise pixels of the same color, wherein each of m and n is a natural number of 2 to 10, wherein the pixel isolation structure comprises:

an outer isolation film, when viewed in a plan view, surrounding each color unit pixel of the plurality of color unit pixels;

at least one inner isolation film comprising a portion between two sub-pixels, which are adjacent to each other from among the plurality of sub-pixels;

a doped isolation liner covering opposite sidewalls of the at least one inner isolation film; and at least one doped isolation pillar contacting at least two sub-pixels selected from the plurality of sub-pixels, and wherein the at least one doped isolation pillar and the at least one inner isolation film, when viewed in the plan view, are connected to each other to define a size of each of the plurality of sub-pixels.

15. The image sensor of claim 14, wherein the plurality of color unit pixels comprise a first green color unit pixel, a red color unit pixel, a blue color unit pixel, and a second green color unit pixel, wherein the plurality of sub-pixels comprised in one color unit pixel selected from the plurality of color unit pixels comprise four sub-pixels arranged in a 2×2 matrix, wherein each of the doped isolation liner and the at least one doped isolation pillar comprises a silicon region doped with P+-type impurities, and wherein the doped isolation liner is integrally connected to the at least one doped isolation pillar.

16. The image sensor of claim 14, wherein the plurality of color unit pixels comprise a first green color unit pixel, a red color unit pixel, a blue color unit pixel, and a second green color unit pixel, wherein the plurality of sub-pixels comprised in one color unit pixel selected from the plurality of color unit pixels comprise nine sub-pixels arranged in a 3×3 matrix, wherein each of the doped isolation liner and the at least one doped isolation pillar comprises a silicon region doped with P+-type impurities, and wherein the doped isolation liner is integrally connected to the at least one doped isolation pillar.

17. The image sensor of claim 14, further comprising:

a floating diffusion region disposed at a first surface of the substrate and overlapping a corresponding doped isolation pillar of the at least one doped isolation pillar in a vertical direction, wherein the corresponding doped isolation pillar extends from a second surface of the substrate to the floating diffusion region;

a plurality of photodiodes disposed in the plurality of sub-pixels, respectively;

a plurality of color filters overlapping the plurality of sub-pixels, respectively, wherein the plurality of color filters are disposed on a back side surface of the substrate; and a plurality of microlenses overlapping the plurality of sub-pixels, respectively, wherein the plurality of color filters are disposed between the plurality of microlenses and the plurality of sub-pixels, respectively.

18. The image sensor of claim 14, wherein the outer isolation film is integrally connected to the at least one inner isolation film, and wherein each of the outer isolation film and the at least one inner isolation film comprises silicon oxide, silicon nitride, silicon carbonitride (SiCN), silicon oxynitride (SiON), silicon oxycarbide (SiOC), polysilicon, a metal, a metal nitride, a metal oxide, borosilicate glass (BSG), phosphosilicate glass (PSG), borophosphosilicate glass (BPSG), plasma-enhanced tetraethyl orthosilicate (PE-TEOS), fluoride silicate glass (FSG), carbon doped silicon oxide (CDO), organosilicate glass (OSG), air, or a combination thereof.

19. The image sensor of claim 14, wherein each of the plurality of color unit pixels comprises nine sub-pixels arranged in a 3×3 matrix, wherein the at least one doped isolation pillar comprises at least four doped isolation pillars spaced apart from each other, and wherein each of the at least four doped isolation pillars contacts a sensing area of each of at least two sub-pixels selected from the nine sub-pixels.

20. An electronic system comprising:

at least one camera module comprising an image sensor; and a processor configured to process image data received from the at least one camera module, wherein the image sensor comprises:

a color unit pixel comprising a plurality of sub-pixels arranged in an m ×n matrix on a substrate, wherein each of m and n is a natural number of 2 to 10; and a pixel isolation structure configured to isolate the plurality of sub-pixels from each other in the color unit pixel, wherein the pixel isolation structure comprises:

an outer isolation film, when viewed in a plan view, surrounding the color unit pixel;

at least one inner isolation film comprising a portion between two sub-pixels, which are adjacent to each other, among the plurality of sub-pixels;

a doped isolation liner covering opposite sidewalls of the at least one inner isolation film; and at least one doped isolation pillar contacting at least two sub-pixels selected from the plurality of sub-pixels, and wherein the at least one doped isolation pillar and the at least one inner isolation film, when viewed in the plan view, are connected to each other to define a size of each of the plurality of sub-pixels.

* * * * *